(12) United States Patent
Yoon et al.

(10) Patent No.: US 12,080,200 B2
(45) Date of Patent: *Sep. 3, 2024

(54) DISPLAY DEVICE

(71) Applicant: LG Display Co., Ltd., Seoul (KR)

(72) Inventors: Sunghwan Yoon, Seoul (KR); HanSeok Kim, Paju-si (KR); Sungeun Bae, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/334,297

(22) Filed: Jun. 13, 2023

(65) Prior Publication Data

US 2023/0326377 A1 Oct. 12, 2023

Related U.S. Application Data

(63) Continuation of application No. 17/317,396, filed on May 11, 2021, now Pat. No. 11,715,395.

(30) Foreign Application Priority Data

Nov. 19, 2020 (KR) .................. 10-2020-0155274

(51) Int. Cl.
  *G09F 9/302* (2006.01)
  *G02F 1/1333* (2006.01)
  (Continued)

(52) U.S. Cl.
  CPC ...... *G09F 9/3026* (2013.01); *G02F 1/133314* (2021.01); *G02F 1/133322* (2021.01);
  (Continued)

(58) Field of Classification Search
  None
  See application file for complete search history.

(56) References Cited

U.S. PATENT DOCUMENTS 10,955,711 B2    3/2021  Kim et al.
11,715,395 B2 *  8/2023  Yoon .................. G02F 1/133314
                                                   361/679.01
(Continued)

FOREIGN PATENT DOCUMENTS

CN    101276077 A    10/2008
CN    114730535 A    7/2022
(Continued)

OTHER PUBLICATIONS

Extended European Search Report dated Sep. 28, 2021, issued in corresponding European Patent Application No. 21169855.0.
(Continued)

*Primary Examiner* — Richard H Kim
(74) *Attorney, Agent, or Firm* — Morgan, Lewis & Bockius LLP

(57) ABSTRACT

The display device may include a display panel and a frame diposed on a rear surface of the display panel. The display device also includes a plurality of binders fixed to the rear surface of the display panel and disposed between the display panel and the frame, and a plurality of coupling members penetrating through the frame and coupled to the plurality of binders. Therefore, the flatness of the display panel attached to the plurality of binders may be improved by adjusting the locations of the frame and the plurality of binders. Also, the display panel and the frame may be easily attached and detached using the plurality of binders and the plurality of coupling members.

16 Claims, 10 Drawing Sheets

(51) Int. Cl.
  *G06F 1/16* (2006.01)
  *H05K 5/00* (2006.01)
  *H05K 5/02* (2006.01)
  *H10K 59/18* (2023.01)

(52) U.S. Cl.
  CPC ........ *G02F 1/13336* (2013.01); *G06F 1/1601* (2013.01); *H05K 5/0217* (2013.01); *H10K 59/18* (2023.02); *G02F 2201/07* (2013.01); *G02F 2201/46* (2013.01); *G02F 2201/48* (2013.01); *G02F 2202/28* (2013.01); *G06F 2200/1635* (2013.01); *H05K 5/0021* (2013.01)

(56) References Cited

U.S. PATENT DOCUMENTS

| | | |
|---|---|---|
| 2006/0066772 A1 | 3/2006 | Takahashi et al. |
| 2008/0239197 A1 | 10/2008 | Kasuga |
| 2011/0163052 A1 | 7/2011 | Kim et al. |
| 2016/0026030 A1 | 1/2016 | Kang et al. |
| 2017/0116895 A1 | 4/2017 | Declerck |
| 2020/0193877 A1 | 6/2020 | Kim |
| 2022/0229327 A1 | 7/2022 | Kang et al. |

FOREIGN PATENT DOCUMENTS

| | | |
|---|---|---|
| GB | 2527131 A | 12/2015 |
| KR | 10-0537021 B1 | 2/2006 |
| KR | 10-20110011916 A | 2/2011 |
| KR | 10-2011-0080923 A | 7/2011 |
| KR | 10-20140035741 A | 3/2014 |
| KR | 10-20140067771 A | 6/2014 |
| KR | 10-2015-0104485 A | 9/2015 |

OTHER PUBLICATIONS

Office Action issued Mar. 4, 2024 for Chinese Patent Application No. 202110419011.3 (See English Translation) (Note: KR 10-2014-0067771 A was cited in a prior IDS.).

* cited by examiner

DISPLAY DEVICE

CROSS-REFERENCE TO RELATED APPLICATIONS

This application is a continuation of application Ser. No. 17/317,396, filed on May 11, 2021, which claims the priority of Korean Patent Application No. 10-2020-0155274 filed on Nov. 19, 2020, in the Korean Intellectual Property Office, the entirety of each of which is incorporated herein by reference for all purposes.

BACKGROUND

Technical Field

The present disclosure relates to a display device, and more particularly, to a display device having an improved flatness.

Discussion of the Related Art

Display devices used for a monitor of a computer, a television (TV), or a cellular phone include an organic light emitting display (OLED) self-emitting light, a liquid crystal display (LCD) requiring a separate light source, and the like.

The display devices are being broadly applied to a monitor of a computer, TV, and a personal portable device. And, a display device having a large display area and a reduced volume and weight is being studied.

Recently, a tiling display device in which a plurality of display devices is connected to increase a display area is attached to a wall and the like to be used as a billboard and the like.

SUMMARY

First, a display device is used from a small-size electronic apparatus used for mobile phones to a large-size electronic apparatus such as a large-size TV. As such, the display device is manufactured from a small size to a large size of tens of inches to be used for various purposes. However, it is technically difficult to manufacture a display device with a very large size of hundreds of inches or more. Therefore, a tiling display device in which a plurality of display devices is connected to increase a display area is used instead. Further, the tiling display device configured with a plurality of display devices is attached to a surface of a wall to be used as a billboard, a large electronic board at a stadium, an outdoor advertising signboard, or the like.

Such a tiling display device may be implemented, for example, by fastening display devices to a wall portion. Each of the display devices includes a display panel substantially without a bezel and a frame attached to the rear surface of the display panel to protect the display panel. However, if the frame has a low flatness, the flatness of the display panel attached to the frame is also decreased. Therefore, a step difference can be generated between a plurality of display devices fastened to the wall portion and the borders between the display devices can be visibly recognized.

Therefore, the frame and the display panel have been attached by using an elastic foam tape to compensate for the flatness of the display panel caused by a low flatness of the frame. The elastic foam tape can compensate for a decrease in flatness caused by foreign materials between the display panel and the frame or deformation of the frame. Here, only a flatness variation of less than the thickness of the foam tape has been considered as a defect to be compensated.

The foam tape has a plurality of pores therein and has a smaller adhesive force than other adhesive members. Thus, the foam tape needs a larger adhesive area than other adhesive members. Therefore, the foam tape was disposed on the entire surface of the frame to attach the display panel and the frame to each other. However, when the display panel and the frame are detached to repair or replace the display panel and/or the frame, a problem occurred in that it is difficult to remove the foam tape disposed on the entire surface of the frame. Further, the display panel and the frame can be damaged when detaching the display panel from the frame. Accordingly, if the display panel and the frame are attached with the foam tape for flatness compensation, a problem occurs in that it is difficult to detach the display panel and the frame when the display panel and the frame need to be repaired and replaced.

Therefore, the present inventors invented a display device in which the flatness of a display panel can be adjusted without being limited to the flatness of a frame and the display and the frame can be easily reassembled.

Accordingly, embodiments of the present disclosure are directed to a display device that substantially obviates one or more of the problems due to limitations and disadvantages of the related art.

An object to be achieved by the present disclosure is to provide a display device having an improved flatness.

Another object to be achieved by the present disclosure is to provide a display device in which the flatness of a display panel is improved regardless of the flatness of a frame.

Yet another object to be achieved by the present disclosure is to provide a display device in which a display panel and a frame can be easily attached to and detached from each other.

Still another object to be achieved by the present disclosure is to provide a display device having an improved reliability of attachment between a display panel and a frame.

Still another object to be achieved by the present disclosure is to reduce a movement of a display panel in a space formed between the display panel and a frame when the frame has a low flatness.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device comprises a display panel and a frame diposed on a rear surface of the display panel. The display device also includes a plurality of binders fixed to the rear surface of the display panel and disposed between the display panel and the frame, and a plurality of coupling members penetrating through the frame and coupled to the plurality of binders. Therefore, the flatness of the display panel attached to the plurality of binders may be improved by adjusting the locations of the frame and the plurality of binders. Also, the display panel and the frame may be easily attached and detached using the plurality of binders and the plurality of coupling members.

In another aspect, a display device comprises a display panel and a plurality of binders bonded to a rear surface of the display panel. The display device also includes an adhesive member that bonds the plurality of binders and the display panel. Further, the display panel includes a frame disposed to cover the display panel and the plurality of binders, and a plurality of coupling members coupled to the frame and the plurality of binders. Some of the plurality of coupling members may be coupled to one surface of the plurality of binders, and the others of the plurality of coupling members may be coupled to side surfaces of the plurality of binders. Therefore, the flatness of the display panel may be improved by adjusting coupling locations between the frame and the plurality of binders in view of the flatness of the frame.

Other detailed matters of the exemplary embodiments are included in the detailed description and the drawings.

According to the present disclosure, it is possible to easily adjust the flatness of the display panel without being limited to the degree of flatness of the frame.

According to the present disclosure, it is possible to easily reassemble the frame and the display panel.

According to the present disclosure, it is possible to improve the quality of adhesion between the display panel and the frame.

According to the present disclosure, it is possible to reduce a movement of the display panel in a space between the display panel and the frame.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
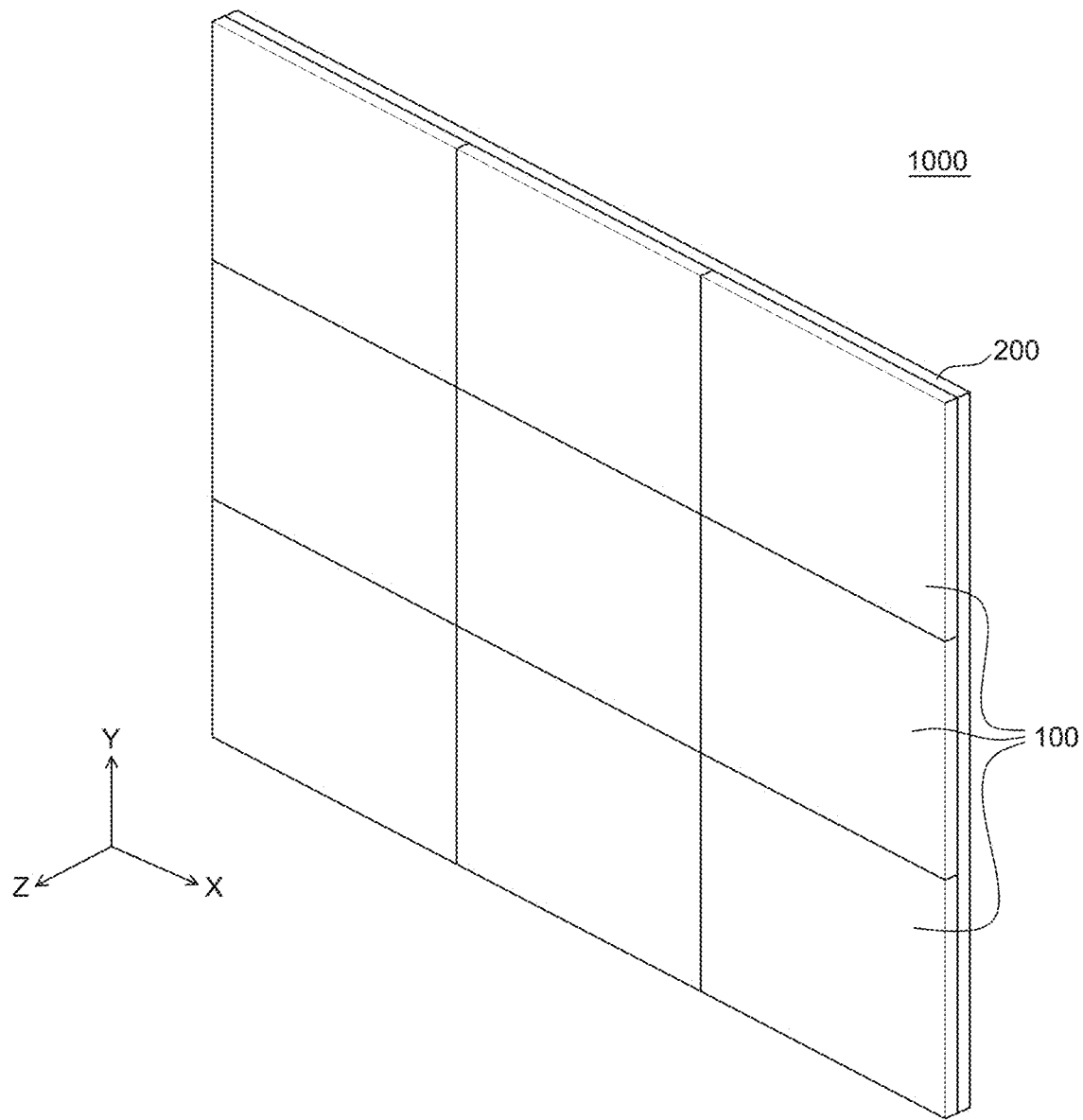
FIG. 1 is a perspective view of a tiling display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a tiling display device according to exemplary embodiments of the present disclosure will be described in detail with reference to accompanying drawings.

FIG. 1 is a perspective view of a tiling display device according to an exemplary embodiment of the present disclosure. Referring to FIG. 1, a tiling display device 1000 according to an exemplary embodiment of the present disclosure is formed by connecting a plurality of display devices 100 according to an exemplary embodiment of the present disclosure.

Referring to FIG. 1, the tiling display device 1000 according to an exemplary embodiment of the present disclosure includes a plurality of display devices 100 and a wall portion 200. The tiling display device 1000 is composed of the plurality of display devices 100 and thus may increase a display area where images are displayed.

Each of the plurality of display devices 100 is attached to the wall portion 200 to be disposed as if it is a single display device. For example, the plurality of display devices 100 may be attached to the wall portion 200 in the form of tiles to implement the tiling display device 1000.

Since the tiling display device 1000 has a very large size, it is difficult to move the plurality of display devices 100 in a connected state to an installation location. Therefore, the plurality of display devices 100 may be moved to the installation location and then assembled into the tiling display device 1000 at the installation location.

The plurality of display devices 100 may be attached as close as possible such that the interval between the plurality of display devices 100 is constant and reduced. Therefore, the plurality of display devices 100 looks like a single display device 100. That is, the plurality of display devices 100 is precisely aligned to be attached to the wall portion 200 so that the borders where images are not displayed may be reduced.

In this case, the plurality of display devices 100 may be aligned in an X-axis direction, a Y-axis direction, and a Z-axis direction to be attached to the wall portion 200. When the plurality of display devices 100 is aligned in the X-axis direction, left edges and right edges of the plurality of display devices 100 disposed in the same columns, respectively, may be aligned straight. Further, when the plurality of display devices 100 is aligned in the Y-axis direction, upper edges and lower edges of the plurality of display devices 100 disposed in the same rows, respectively, may be aligned straight. Furthermore, when the plurality of display devices 100 is aligned in the Z-axis direction, all front surfaces of the plurality of display devices 100 may be aligned on a flat surface to remove a step difference between the plurality of display devices 100.

If the plurality of display devices 100 is misaligned in any one of the X-axis, Y-axis and Z-axis directions, the borders between the plurality of display devices 100 where images are not displayed may be visibly recognized by a user. When the borders are visibly recognized by the user, immersion may be inhibited when the user watches images and it may be difficult to display clear images.

Therefore, when the plurality of display devices 100 is attached to the wall portion 200, it is important to align the plurality of display devices 100 in each of the X-axis direction, the Y-axis direction, and the Z-axis direction. Further, when the plurality of display devices 100 is attached to the wall portion 200 using a fastening member, attachment locations of the plurality of display devices 100 may be primarily aligned. However, a minute misalignment between the plurality of display devices 100 may occur due to an error or a mechanism tolerance generated when an operator attaches the plurality of display devices 100. For example, if the locations of the plurality of display devices 100 in the Z-axis direction, i.e., the respective flatnesses of the plurality of display devices 100, are different from each other, the borders between the plurality of display devices 100 can be visibly recognized. Therefore, it may be important to improve the respective flatnesses of the plurality of display devices 100. Therefore, in the tiling display device 1000 according to an exemplary embodiment of the present disclosure, a plurality of first binders BD1 is disposed in each display device 100 to improve the respective flatnesses of the plurality of display devices 100. Accordingly, it is possible to reduce an alignment error in the Z-axis direction.

Hereinafter, the display device 100 according to an exemplary embodiment of the present disclosure will be described in detail with reference to FIG. 2 through FIG. 4.

Figure 2:
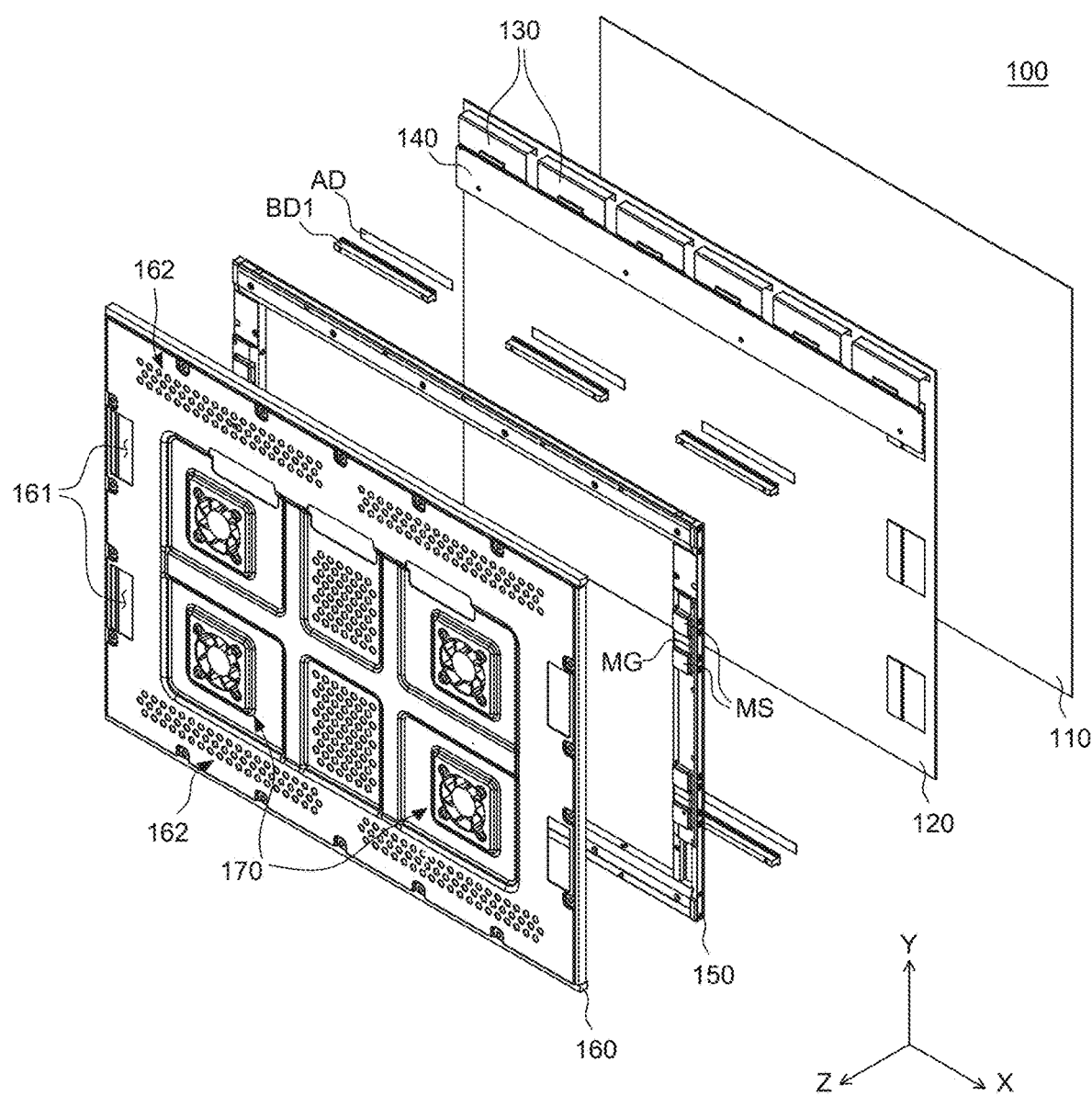
FIG. 2 is an exploded perspective view of the display device according to an exemplary embodiment of the present disclosure.

FIG. 2 is an exploded perspective view of the display device according to an exemplary embodiment of the present disclosure. FIG. 3 is an exploded perspective view of the display device according to an exemplary embodiment of the present disclosure. FIG. 4 is a rear view of the display device according to an exemplary embodiment of the present disclosure. Specifically, FIG. 2 is an exploded perspective view of the display device 100 as viewed from a rear surface of the display device 100. FIG. 3 is an exploded perspective view of the display device 100 as viewed from a front surface of the display device 100. FIG. 3 illustrates a frame 150, a plurality of first binders BD1, a plurality of first coupling members SC1, a plurality of adhesive members AD, a plurality of panel magnets MG and a plurality of panel ferromagnetic materials MS for the convenience of the description. FIG. 4 omits the illustration of a cover shield 160.

Referring to FIG. 2, the display device 100 includes a protection plate 110, a display panel 120, a plurality of flexible films 130, a printed circuit board 140, the frame 150, the cover shield 160, and a heat radiation fan 170. Also, the display device 100 includes the plurality of panel magnets MG, the plurality of panel ferromagnetic materials MS, the plurality of first binders BD1, and the plurality of adhesive members AD.

First, the display panel 120 is configured to display images to the user. In the display panel 120, display elements and circuits, wiring lines, components, and the like for driving the display elements may be disposed. The display elements may be defined in different ways depending on a type of the display panel 120. For example, when the display panel 120 is an organic light emitting display panel, the display element may be an organic light emitting diode including an anode, an organic emission layer, and a cathode. For example, when the display panel 120 is an inorganic light emitting display panel, the display element may be a light emitting diode (LED) or a micro LED including an n-type semiconductor layer, a p-type semiconductor layer, and an emission layer. However, the display panel 120 is not limited thereto and the display element of the display panel 120 may be configured in various forms.

The plurality of flexible films 130 is bonded to a rear surface of the display panel 120. The flexible film 130 may be a film in which various components are disposed on a base film having malleability. The flexible film 130 may supply a signal to the display elements and the circuits and may be electrically connected to the display panel 120. The plurality of flexible films 130 may supply a power voltage, a data voltage, or the like to the display panel 120. FIG. 2 illustrates six flexible films 130 bonded to a long side of the display panel 120. However, the number and locations of plurality of flexible films 130 may vary depending on the design and are not limited thereto.

On the plurality of flexible films 130, driver ICs such as gate driver ICs or data driver ICs may be disposed. The driver ICs are configured to process data for displaying an image and a driving signal for processing the data. The driver ICs may be mounted in a Chip-On-Glass (COG) method, a Chip-On-Film (COF) method, a Tape-Carrier-Package (TCP) method, or the like depending on a mounting method. However, for the convenience of the description, the driver ICs are described as mounted on the plurality of flexible films 130 in the COF method, but the present disclosure is not limited thereto.

The printed circuit board 140 is electrically connected to the plurality of flexible films 130. The printed circuit board 140 is configured to supply signals to the driver ICs. On the printed circuit board 140, various components for supplying various signals, such as a drive signal or a data signal to the driver ICs may be disposed. FIG. 2 illustrates a single printed circuit board 140. However, the number of printed circuit boards 140 may vary depending on the design and is not limited thereto.

The frame 150 is disposed on the rear surface of the display panel 120. The frame 150 on the rear surface of the display panel 120 may support and protect the display panel 120. The frame 150 may be made of a material having rigidity. For example, the frame 150 may be made of a metal material such as aluminum (Al), copper (Cu), zinc (Zn), silver (Ag), gold (Au), iron (Fe), Steel Use Stainless (SUS) or Invar, a plastic material, or the like.

The frame 150 may have a shape corresponding to the edges of the display panel 120. For example, the frame 150 may have a frame shape corresponding to the edges of the display panel 120. The frame 150 may support edges of the display panel 120 to maintain the flatness of the display panel 120. Alternatively, the frame 150 may have the same shape as a flat surface shape of the display panel 120, and the shape of the frame 150 is not limited thereto as long as it can support the display panel 120.

Figure 3:
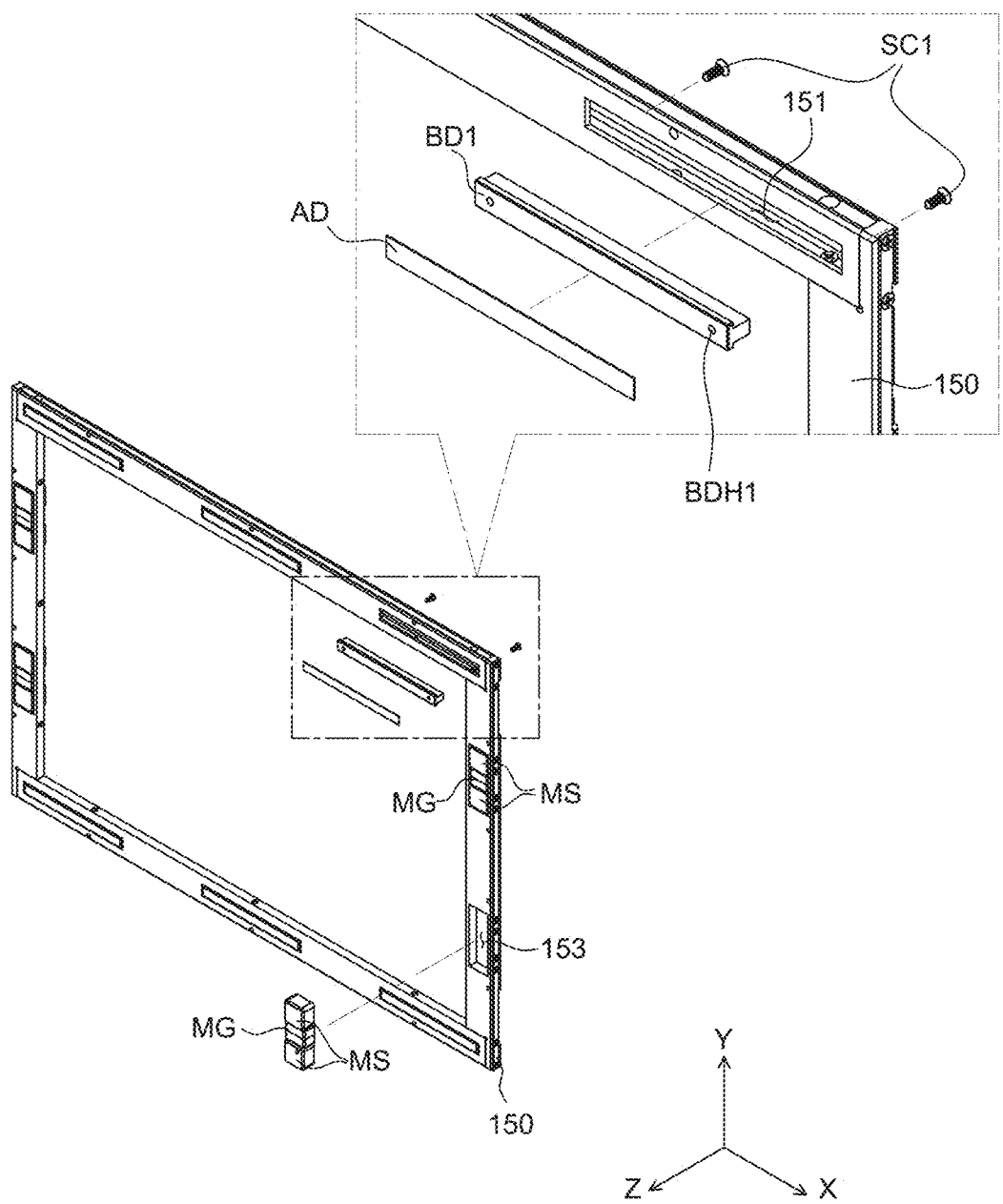
FIG. 3 is an exploded perspective view of the display device according to an exemplary embodiment of the present disclosure.

Referring to FIG. 2 and FIG. 3, the frame 150 includes a plurality of grooves 151 and a plurality of holes 153.

The plurality of first binders BD1 is mounted on the plurality of grooves 151, respectively. The plurality of grooves 151 may be formed in one surface of the frame 150 facing the display panel 120, and the plurality of first binders BD1 may be inserted into the plurality of grooves 151. The plurality of grooves 151 is disposed in the frame 150 having a shape corresponding to the edges of the display panel 120 and thus may overlap the display panel 120 in the vicinity of the edges. In the drawings, three grooves 151 are illustrated as disposed at each of an upper end and a lower end of the frame 150, respectively, but the number and locations of plurality of grooves 151 are not limited thereto.

The plurality of panel magnets MG and the plurality of panel ferromagnetic materials MS are inserted into the plurality of holes 153. The plurality of holes 153 is formed by penetrating through one surface of the frame 150 facing the display panel 120 and the opposite surface thereto. The plurality of panel magnets MG and the plurality of panel ferromagnetic materials MS may be inserted into the plurality of holes 153. The plurality of holes 153 is disposed in the frame 150 having a shape corresponding to the edges of the display panel 120 and thus may overlap the display panel 120 in the vicinity of the edges. In the drawings, two holes 153 are illustrated as disposed at each of a left side and a right side of the frame 150, respectively, but the number and locations of plurality of holes 153 are not limited thereto.

Meanwhile, the frame 150 further includes a plurality of first coupling holes formed in bottom surfaces of the plurality of grooves 151 to allow the plurality of first coupling members SC1 to penetrate therethrough. This will be described in detail with reference to FIG. 5A and FIG. 5B.

Referring to FIG. 2 and FIG. 3, the plurality of first binders BD1 is disposed between the display panel 120 and the frame 150. The plurality of first binders BD1 is configured to couple the display panel 120 and the frame 150. Also, the plurality of first binders BD1 is configured to adjust the flatness of the display panel 120.

The plurality of first binders BD1 may be disposed along the edges of the display panel 120. Long sides of the plurality of first binders BD1 may be disposed along the edges of the display panel 120. The long sides of the plurality of first binders BD1 may be disposed in parallel to the most adjacent edge of the display panel 120. For example, the long side of the first binder BD1 disposed adjacent to the upper edge of the display panel 120 may be disposed in parallel to the upper edge of the display panel 120. If the long sides of the plurality of first binders BD1 are disposed along the edges of the display panel 120, the flatness of the display panel 120 may be more easily adjusted. The adjustment of the flatness of the display panel 120 by the plurality of first binders BD1 will be described in more detail with reference to FIG. 5A and FIG. 5B.

In the drawings, three first binders BD1 are illustrated as disposed adjacent to the upper edge of the display panel 120 and three first binders BD1 are illustrated as disposed adjacent to the lower edge of the display panel 120. However, the plurality of first binders BD1 may be disposed at the left edge and the right edge of the display panel 120, and the number and locations of plurality of first binders BD1 are not limited thereto.

The plurality of first binders BD1 includes first fixing holes BDH1 to be coupled to the plurality of first coupling members SC1. The plurality of first binders BD1 may be inserted into the plurality of grooves 151 of the frame 150 so as to be coupled to the plurality of first coupling members SC1. The plurality of first binders BD1 may be mounted inside the plurality of grooves 151 so as to be coupled to the plurality of first coupling members SC1. The first fixing holes BDH1 are configured for coupling to the plurality of first coupling members SC1 and may be formed in one surface of the first binders BD1 facing the bottom surfaces of the plurality of grooves 151. The first fixing holes BDH1 may be disposed corresponding to the plurality of first coupling holes of the frame 150.

The plurality of first coupling members SC1 penetrating through the plurality of first coupling holes may be disposed on a rear surface of the frame 150. The plurality of first coupling members SC1 may be coupled to the plurality of first binders BD1 with the frame 150 interposed therebetween. Here, the plurality of first coupling members SC1 may be inserted into the first fixing holes BDH1 of the plurality of first binders BD1 so as to be coupled to the plurality of first binders BD1.

For example, the plurality of first coupling members SC1 may be screws with threads. Also, the first fixing holes BDH1 of the plurality of first binders BD1 into which the plurality of first coupling members SC1 is inserted may be holes with screw threads on the inner circumferential surface. In this case, the head of the first coupling member SC1 is disposed on the rear surface of the frame 150, and at least a part of the screw thread may be inserted into the first fixing hole BDH1 inside the plurality of grooves 151. Although the plurality of first coupling members SC1 is illustrated as screws in the drawings, the type of the plurality of first coupling members SC1 is not limited thereto. Hereinafter, for the convenience of the description, it will be assumed that the plurality of first coupling members SC1 is screws with threads and the first fixing holes BDH1 of the first binders BD1 are holes with screw threads on the inner circumferential surface. However, the present disclosure is not limited thereto.

If the first coupling member SC1 with a screw thread is inserted into the first fixing hole BDH1 and rotated in any one of a clockwise direction and a counter-clockwise direction, the first coupling member SC1 may be rotated at the same spot. Also, the first binder BD1 may be moved along the screw thread of the first coupling member SC1 in a direction to be separated from the first coupling member SC1. That is, if the first coupling member SC1 is rotated in one direction, the first binder BD1 is moved along the screw thread of the first coupling member SC1. Therefore, the first binder BD1 may be moved to the outside of the plurality of grooves 151 and toward the display panel 120 and may be finally separated from a first coupling member SC1.

On the contrary, if the first coupling member SC1 is rotated in the other of the clockwise direction and the counter-clockwise direction, the first coupling member SC1 may be rotated at the same spot. Also, the first binder BD1 may be moved along the screw thread of the first coupling member SC1 in a direction to be coupled to the first coupling member SC1. That is, if the first coupling member SC1 is rotated in the other direction, the first binder BD1 is moved along the screw thread of the first coupling member SC1. Therefore, the first binder BD1 may be moved to the inside of the plurality of grooves 151 and toward the frame 150 and may be finally coupled as much as possible to the screw thread of the first coupling member SC1. Accordingly, the first coupling members SC1 are rotated in the clockwise direction or the counter-clockwise direction to adjust outer surfaces of the plurality of first binders BD1 to be disposed on the same flat surface.

The plurality of adhesive members AD is disposed between the plurality of first binders BD1 and the display panel 120. The adhesive members AD may be made of an adhesive material to fix the first binders BD1 to the rear surface of the display panel 120. For example, the adhesive members AD may be adhesive acrylic double-sided tapes, but are not limited thereto.

The plurality of panel magnets MG is disposed on the rear surface of the display panel 120. The plurality of panel magnets MG on the rear surface of the display panel 120 may be inserted into the plurality of holes 153 of the frame 150. The plurality of panel magnets MG is disposed on the rear surface of the display panel 120 and used for attaching the display device 100 to the wall portion 200. For example, each of the plurality of panel magnets MG may be a bar-type magnet having one N pole and one S pole, but is not limited thereto. Here, the plurality of panel magnets MG may be fixed to the plurality of holes 153 of the frame 150 using the adhesive members AD or other fastening members, but is not limited thereto.

The plurality of panel ferromagnetic materials MS is disposed on the rear surface of the display panel 120. The plurality of panel ferromagnetic materials MS on the rear surface of the display panel 120 may be disposed in the plurality of holes 153 of the frame 150. The plurality of panel ferromagnetic materials MS may be disposed on both side surfaces of each of the plurality of panel magnets MG. Each of the plurality of panel magnets MG may be disposed between the plurality of panel ferromagnetic materials MS. For example, one of the plurality of panel ferromagnetic materials MS may be in contact with the N pole of the panel magnet MG and another panel ferromagnetic material MS may be in contact with the S pole of the panel magnet MG. Each of the plurality of panel magnets MG may be disposed between two panel ferromagnetic materials MS. The plurality of panel ferromagnetic materials MS may be made of a ferromagnetic material, for example, steel, but is not limited thereto.

The display device 100 may be attached to the wall portion 200 using the plurality of panel magnets MG and the plurality of panel ferromagnetic materials MS. For example, when the display device 100 is brought into contact with the wall portion 200, magnetic lines of force are induced among the wall portion 200, the panel magnets MG and the panel ferromagnetic materials MS. Thus, the display device 100 may be fixed to the wall portion 200. Here, the display device 100 may also be attached to the wall portion 200 using only the plurality of panel magnets MG without the plurality of panel ferromagnetic materials MS. The method of attaching the display device 100 to the wall portion 200 using the plurality of panel magnets MG and the plurality of panel ferromagnetic materials MS is just an example. Instead of the plurality of panel magnets MG and the plurality of panel ferromagnetic materials MS, other fastening members may be disposed. However, the present disclosure is not limited thereto.

Figure 4:
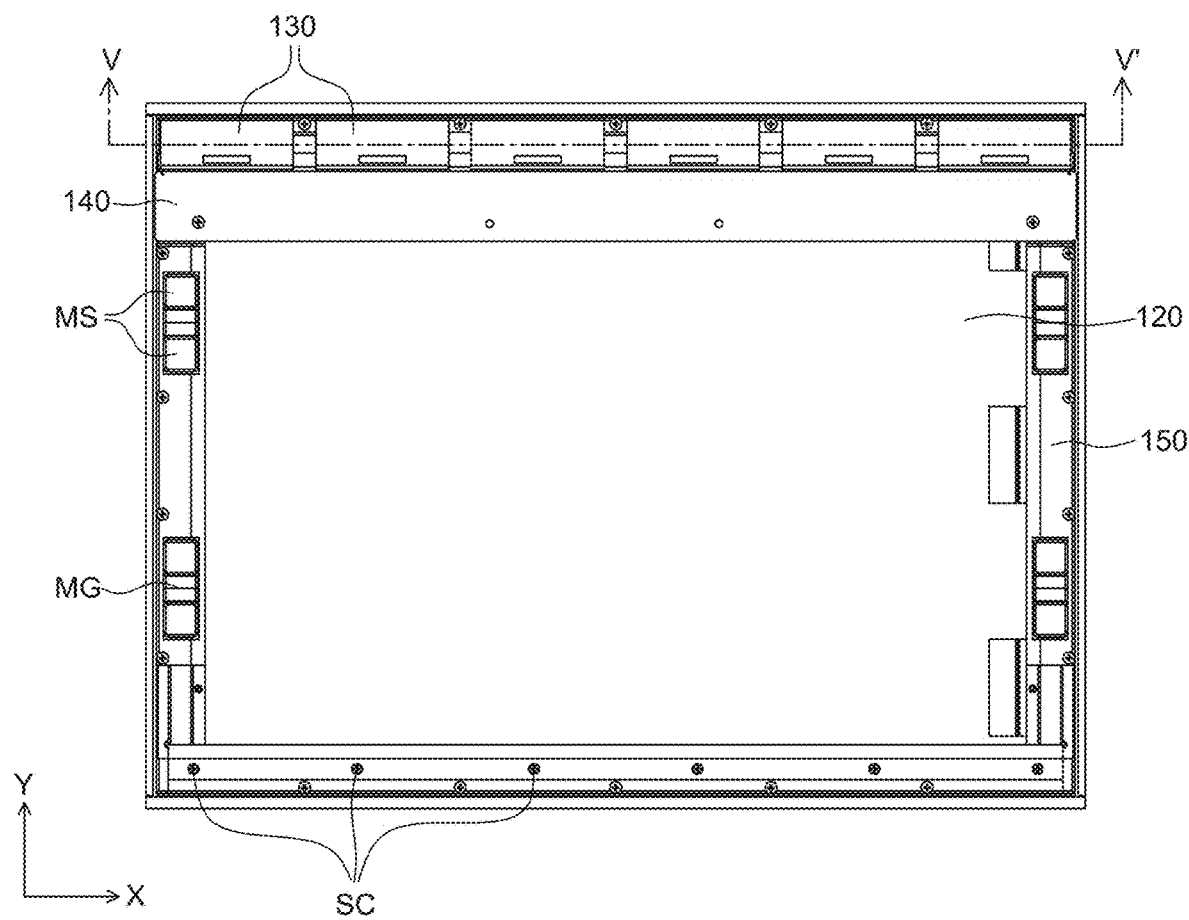
FIG. 4 is a rear view of the display device according to an exemplary embodiment of the present disclosure.

Referring to FIG. 2 and FIG. 4, the cover shield 160 is disposed on the rear surface of the frame 150. The cover shield 160 on the rear surface of the frame 150 may cover the plurality of flexible films 130 and the printed circuit board 140. Specifically, the plurality of flexible films 130 is bonded to the rear surface of the display panel 120. Further, the frame 150 on the rear surface of the display panel 120 may be coupled to the display panel 120 using the first binders BD1. Here, the plurality of flexible films 130 and the printed circuit board 140 are not disposed between the display panel 120 and the frame 150, but disposed to cover the frame 150. Each of the plurality of flexible films 130 is a film in which various components are disposed on a base film having malleability as described above and thus can be easily bent. Therefore, the plurality of flexible films 130 is bent to cover the frame 150 so that the plurality of flexible films 130 and the printed circuit board 140 are disposed on the display panel 120 and the frame 150.

The cover shield 160 is disposed to cover the display panel 120, the plurality of flexible films 130, the printed circuit board 140 and the frame 150. Specifically, the frame 150 does not cover the plurality of flexible films 130 and the printed circuit board 140. Thus, it may be difficult to protect the plurality of flexible films 130 and the printed circuit board 140 against external impacts. Accordingly, the cover shield 160 may be disposed on the rear surface of the frame 150 to protect the plurality of flexible films 130 and the printed circuit board 140. The cover shield 160 is disposed to cover the display panel 120, the plurality of flexible films 130, the printed circuit board 140 and the frame 150. Thus, the cover shield 160 may protect the other components of the display device 100, particularly, the plurality of flexible films 130 and the printed circuit board 140.

The cover shield 160 includes a plurality of first holes 161 that exposes the plurality of panel magnets MG and the plurality of panel ferromagnetic materials MS and a plurality of second holes 162 for heat radiation.

Referring to FIG. 2, the plurality of first holes 161 exposes the plurality of panel magnets MG and the plurality of panel ferromagnetic materials MS fixed to the rear surface of the frame 150. The plurality of panel magnets MG and the plurality of panel ferromagnetic materials MS exposed through the plurality of first holes 161 may be brought into closer contact with the wall portion 200, and the intensity of magnetic lines of force may increase. If the plurality of panel magnets MG and the plurality of panel ferromagnetic materials MS are covered by the cover shield 160, the cover shield 160 may increase the interval between the wall portion 200 and the plurality of panel magnets MG and the plurality of panel ferromagnetic materials MS. Thus, the intensity of magnetic lines of force may decrease and the display device 100 may be detached from the wall portion 200. Accordingly, the plurality of first holes 161 may be disposed such that the plurality of panel magnets MG and the plurality of panel ferromagnetic materials MS are disposed adjacent to the wall portion 200. Therefore, it is possible to securely attach the display device 100 to the wall portion 200.

The plurality of second holes 162 may be disposed to overlap at least the flexible films 130 and the printed circuit board 140. The plurality of second holes 162 is configured to radiate heat generated from the display device 100 when the display device 100 is driven. Here, the plurality of second holes 162 is disposed to overlap at least the flexible films 130 and the printed circuit board 140 which have high heat generation. Thus, it is possible to effectively radiate heat generated from the display device 100. FIG. 2 illustrates that the plurality of second holes 162 is disposed on an upper side of the cover shield 160, a lower side of the cover shield 160 and a central portion of the cover shield 160. However, the locations of the plurality of second holes 162 are not limited thereto.

The heat radiation fan 170 may be disposed on the rear surface of the display panel 120. The heat radiation fan 170 may circulate air between the cover shield 160 and the display panel 120 to radiate heat generated when the display device 100 is driven. The heat radiation fan 170 may be used to convect air inside the display device 100 and thus radiate heat from the display device 100. Here, the air may be introduced and discharged through the heat radiation fan 170 and the plurality of second holes 162 of the cover shield 160. FIG. 2 illustrates four heat radiation fans 170. However, the heat radiation fan 170 may be omitted depending on the design, and the number and locations of heat radiation fans 170 are not limited thereto.

The protection plate 110 is disposed to cover a front surface of the display panel 120. The protection plate 110 may be disposed to cover the display panel 120 so as to protect the display panel 120 against external impacts, moisture, heat, and the like. The protection plate 110 may be made of a material having impact resistance and light transmittance. For example, the protection plate 110 may be a substrate made of glass. Also, the protection plate 110 may be a thin film made of a plastic material such as polycarbonate (PC), polyimide (PI), polymethylmethacrylate (PMMA) and polyethylene terephthalate (PET), but is not limited thereto.

As described above, the display panel 120 may be coupled to the frame 150 using the plurality of first binders BD1 and the plurality of first coupling members SC1. The frame 150 may be made of a rigid material such as metal to support the display panel 120. If the frame 150 is made of a metal material, the frame 150 may be manufactured by extrusion or the like. However, the flatness of the frame 150 may be different from a design value due to various tolerances in manufacturing of the frame 150. For example, a plurality of corners of the frame 150 are located at different locations in the Z-axis direction and thus may be disposed on different XY planes. When the frame 150 has a low flatness, the flatness of the display panel 120 fixed to the frame 150 may vary due to influence of the flatness of the frame 150. For example, if the display panel 120 is fixed to the frame 150 whose one of the plurality of corners is disposed on a different XY plane from another corner, one of the corners of the display panel 120 may also be disposed on a different XY plane from another corner. Therefore, the edges of the display panel 120 may not be disposed on the same plane, and the flatness of the display panel 120 may be decreased.

Then, if the tiling display device 1000 is implemented by aligning the display device 100 on the wall portion 200, a step difference may be generated between the plurality of display devices 100 in the Z-axis direction. Thus, the borders between the plurality of display devices 100 can be visibly recognized. That is, a step difference may be generated between the edges of the display devices 100, and, thus, the borders can be visibly recognized. In the display device 100 according to an exemplary embodiment of the present disclosure, the flatness of the display panel 120 may be improved using the plurality of first binders BD1 and the plurality of first coupling members SC1 regardless of the flatness of the frame 150.

Hereinafter, the adjustment of the flatness of the display panel 120, i.e., a Z-axial step difference, using the plurality of first binders BD1 and the first coupling members SC1 will be described with reference to FIG. 5A and FIG. 5B.

Figure 5A:
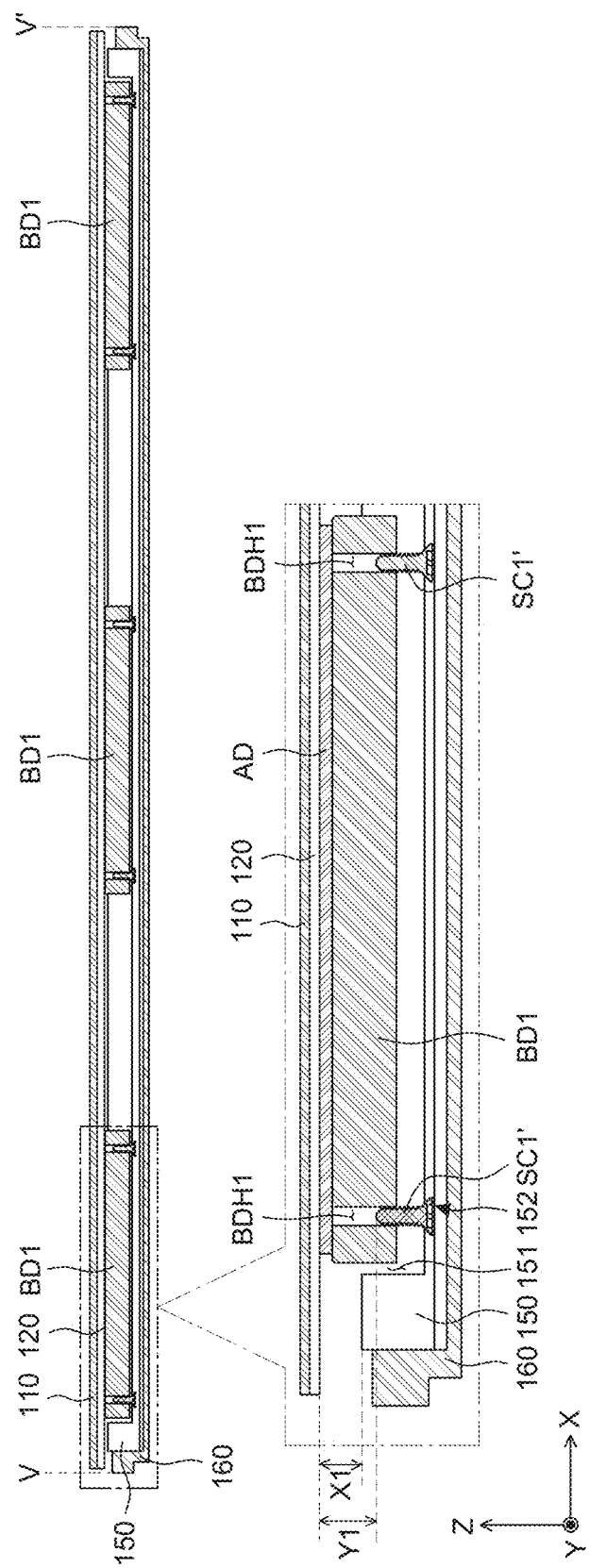
FIG. 5A and FIG. 5B are cross-sectional views taken along the line V-V' of FIG. 4.
Figure 5B:
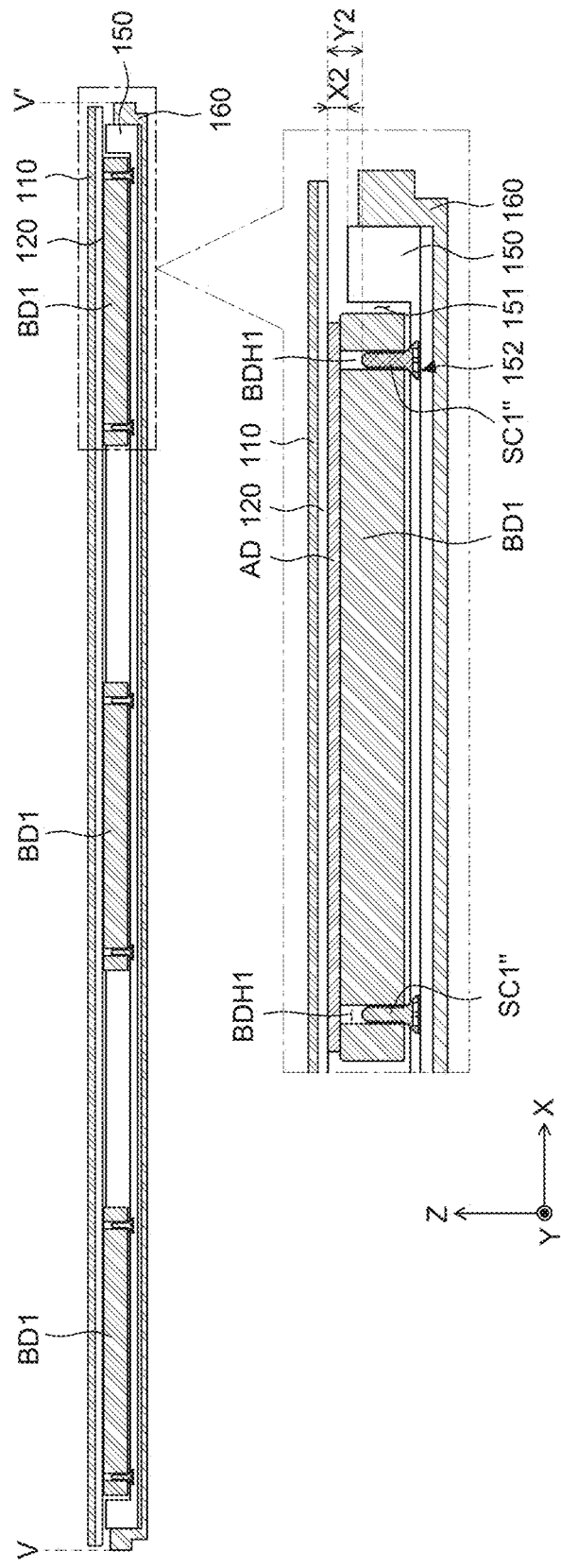

FIG. 5A and FIG. 5B are cross-sectional views taken along the line V-V' of FIG. 4. Specifically, FIG. 5A shows a cross-sectional view of the display device 100 according to an exemplary embodiment of the present disclosure and an enlarged view of a first coupling member SC1' among the plurality of first coupling members SC1. FIG. 5B shows a cross-sectional view of the display device 100 according to an exemplary embodiment of the present disclosure and an enlarged view of another first coupling member SC1" among the plurality of first coupling members SC1. For the convenience of the description, FIG. 5A and FIG. 5B omit the illustration of the cross sections of the plurality of flexible films 130 and the printed circuit board 140.

Hereinafter, for the convenience of the description, one of the plurality of first coupling members SC1 disposed in an area where the interval between the display panel 120 and the frame 150 is the greatest is defined as the first coupling member SC1'. Also, one of the plurality of first coupling members SC1 disposed in an area where the interval between the display panel 120 and the frame 150 is smallest is defined as the first coupling member SC1". However, this is just an example and the present disclosure is not limited thereto.

Referring to FIG. 5A and FIG. 5B, the frame 150 includes a plurality of first coupling holes 152. The plurality of first coupling holes 152 is formed in the bottom surfaces of the plurality of grooves 151 and may communicate with the plurality of grooves 151. The plurality of first coupling members SC1 may penetrate through the plurality of first coupling holes 152. The plurality of first coupling members SC1 may be inserted through the plurality of first coupling holes 152 into the first fixing holes BDH1 of the first binders BD1 inserted into the plurality of grooves 151.

Here, the plurality of first coupling holes 152 may have a smaller size than the heads of the plurality of first coupling members SC1 to allow only the screw threads of the plurality of first coupling members SC1 to penetrate therethrough. If the plurality of first coupling holes 152 has a greater size than the heads of the plurality of first coupling members SC1, the heads of the plurality of first coupling members SC1 may not be fixed to the rear surface of the frame 150. Also, the first binders BD1 and the plurality of first coupling members SC1 may be separated from the frame 150. Therefore, the plurality of first coupling holes 152 may have a smaller size than the heads of the plurality of first coupling members SC1 to fix the frame 150 and the display panel 120.

The plurality of first coupling members SC1 may be inserted to different depths into the first fixing holes BDH1 of the first binders BD1, respectively. For example, a portion of the frame 150 where the first coupling member SC1' among the plurality of first coupling members SC1 is disposed may be disposed on a different plane from another portion of the frame 150 where the first coupling member SC1" is disposed. That is, if the frame 150 has a low flatness, one surface of the frame 150 may not be disposed on the same plane. For example, an interval X1 between a part of the frame 150 where the first coupling member SC1' is disposed and the display panel 120 may be greatest. Also, an interval X2 between the other part of the frame 150 where the first coupling member SC1" is disposed and the display panel 120 may be smallest. If the frame 150 and the display panel 120 are attached to each other without using the first binders BD1 and the first coupling members SC1, the edges of the display panel 120 may be deformed so as to correspond to edges of the frame 150. Therefore, the flatness may be decreased.

Referring to FIG. 5A, an interval Y1 between the first coupling member SC1' among the plurality of first coupling members SC1 and the display panel 120 may be greatest. In other words, the first coupling member SC1' may be a first coupling member SC1 disposed in the portion where the interval X1 between the frame 150 and the display panel 120 is greatest. Specifically, the head of each of the plurality of first coupling members SC1 is in contact with the rear surface of the frame 150. Thus, the intervals between the plurality of first coupling members SC1 and the display panel 120 may be influenced by the flatness of the frame 150. Accordingly, the interval Y1 between the first coupling member SC1' and the display panel 120 may be the greatest in an area where the interval X1 between the frame 150 and the display panel 120 is greatest. In this case, the first coupling member SC1' may be inserted to a minimum depth into the first fixing hole BDH1, and the first binder BD1 coupled to the first coupling member SC1' may be protruded to the outside of the plurality of grooves 151.

In the area where the interval X1 between the frame 150 and the display panel 120 is greatest, a part of the first coupling member SC1' inserted into the first binder BD1 may have a smallest length. As the length of the part of the first coupling member SC1' inserted into the first binder BD1 increases, the first binder BD1 may be disposed to be more adjacent to the bottom surfaces of the plurality of grooves 151. On the contrary, as the length of the part of the first coupling member SC1' inserted into the first binder BD1 decreases, the first binder BD1 may become farther away from the bottom surfaces of the plurality of grooves 151. Further, the first binder BD1 may be protruded to the outside of the plurality of grooves 151. In the area where the interval X1 between the frame 150 and the display panel 120 is greatest, the part of the first coupling member SC1' inserted into the first binder BD1 may be designed to have a smallest length. Thus, the first binder BD1 may be protruded to the outside of the groove 151 and an outer side surface of the first binder BD1 may be disposed on the same plane as outer side surfaces of the other first binders BD1. Therefore, even if the frame 150 has a low flatness, the flatness of the display panel 120 fixed to the first binders BD1 may be compensated for by adjusting the lengths of parts of the first coupling members SC1 to be inserted into the first binders BD1.

Referring to FIG. 5B, an interval Y2 between the first coupling member SC1" among the plurality of first coupling members SC1 and the display panel 120 may be smallest. In other words, the first coupling member SC1" may be a first coupling member SC1 disposed in the portion where the interval X2 between the frame 150 and the display panel 120 is smallest. As described above, the head of each of the plurality of first coupling members SC1 is disposed on the rear surface of the frame 150. Thus, the interval Y2 between each of the plurality of first coupling members SC1 and the display panel 120 may be influenced by the flatness of the frame 150. Accordingly, the interval Y2 between the first coupling member SC1" and the display panel 120 may be smallest in an area where the interval X2 between the frame 150 and the display panel 120 is smallest. In this case, the first coupling member SC1" may be inserted to a maximum depth into the first fixing hole BDH1. Also, the first binder BD1 coupled to the first coupling member SC1" may be disposed to be most adjacent to the bottom surfaces of the plurality of grooves 151, compared to the other first binders BD1.

In the area where the interval X2 between the frame 150 and the display panel 120 is smallest, a part of the first coupling member SC1" inserted into the first binder BD1 may have the greatest length. In the area where the interval X2 between the frame 150 and the display panel 120 is smallest, the part of the first coupling member SC1" inserted into the first binder BD1 is designed to have the greatest length. Thus, the first binder BD1 may be mounted inside the groove 151 and an outer side surface of the first binder BD1 may be disposed on the same plane as outer side surfaces of the other first binders BD1. Therefore, even if the frame 150 has a low flatness, the flatness of the display panel 120 fixed to the first binders BD1 may be compensated for by adjusting the lengths of parts of the first coupling members SC1 to be inserted into the first binders BD1.

Meanwhile, the plurality of first binders BD1 may be disposed along the edge of the display panel 120, i.e., the long sides of the plurality of first binders BD1 are disposed corresponding to the edge of the display panel 120. Thus, the flatness of the display panel 120 may be more easily adjusted. In the tiling display device 1000, if there is a step difference between the edges of adjacent display panels 120, the border may be visibly recognized. Accordingly, it is important to remove a step difference between the edges of a plurality of display panels 120. Therefore, the plurality of first binders BD1 is disposed along the edges of the display panel 120 so that a Z-axial step difference at the edges of the display panels 120 may be easily adjusted. If the plurality of first binders BD1 is disposed to be more adjacent to a central portion of the display panel 120 than to the edges of the display panel 120, it may be difficult to adjust the Z-axial step difference at the edges of the display panels 120 even using the first binders BD1. Therefore, the plurality of first binders BD1 is disposed along the edges of the display panel 120, and, thus, it is possible to improve adjustment of the flatness of the display panel 120 using the plurality of first binders BD1.

For example, if a display panel is attached to a frame whose entire surface is coated with an adhesive member, the flatness of the display panel may vary depending on the flatness of the frame. Accordingly, the display panel may be attached to the frame using a foam tape in order to compensate for a decrease in the flatness of the display panel caused by the flatness of the frame. If the frame is deformed or foreign materials are present between the display panel and the frame, the flatness of the display panel may vary, but the elastic foam tape is deformed instead of the display panel. Thus, a flatness variation of the display panel may be reduced. However, the flatness of the display panel may be compensated for within the range of the thickness or less of the foam tape. Therefore, the foam tape is limited in compensating for the flatness of the display panel. In order to compensate for the flatness of the display panel, it has been contemplated to increase the flatness of the frame instead of using the foam tape that can compensate only for a deformation of the thickness or less. However, an increase in the flatness of the frame results in an increase in manufacturing cost.

In the display device 100 according to an exemplary embodiment of the present disclosure, the plurality of first binders BD1 is disposed between the display panel 120 and the frame 150. Thus, it is possible to minimize an increase in manufacturing cost and easily improve the flatness of the display panel 120. Specifically, if the frame 150 disposed on the rear surface of the display panel 120 to support the edges of the display panel 120 has a low flatness, the flatness of the edges of the display panel 120 may also be decreased. In this case, the plurality of first binders BD1 is disposed between the display panel 120 and the frame 150 and the lengths of the first coupling members SC1 to be inserted into the plurality of first binders BD1 may be adjusted. Thus, the flatness of the display panel 120 may be improved. The plurality of first coupling members SC1 may penetrate through the first coupling holes 152 of the frame 150 from the rear surface of the frame 150 and then may be inserted into the first binders BD1 between the frame 150 and the display panel 120. Then, the plurality of first coupling members SC1 inserted into the first fixing holes BDH1 of the plurality of first binders BD1 may be rotated in the clockwise direction or the counter-clockwise direction. In this case, the plurality of first binders BD1 may be moved toward the inside or outside of the plurality of grooves 151 along the screw threads on inner circumferential surfaces of the first fixing holes BDH1. Accordingly, by rotating the plurality of first coupling members SC1, the locations of the plurality of first binders BD1 may be adjusted in the Z-axis direction. Also, the location of a part of the display panel 120 bonded to the plurality of first binders BD1 may be adjusted in the Z-axis direction. Therefore, in the display device 100 according to an exemplary embodiment of the present disclosure, the plurality of first binders BD1 which is movable in the Z-axis direction is disposed between the display panel 120 and the frame 150. Thus, it is possible to easily adjust the flatness of the display panel 120 regardless of the flatness of the frame 150.

Meanwhile, in order to attach the display panel to the frame, it may be contemplated to dispose the foam tape on the entire surface of the frame. However, when the display panel needs to be separated from the frame due to a defective assembly of the display panel and the frame, it is difficult to remove the adhesive member coated on the entire surface of the frame. Also, the display panel and the frame may be damaged in the process of separating the display panel and the frame.

Therefore, in the display device 100 according to an exemplary embodiment of the present disclosure, the display panel 120 and the frame 150 are assembled by screw coupling. Thus, the display panel 120 and the frame 150 may be easily attached to and detached from each other. Specifically, the display panel 120 and the plurality of first binders BD1 are bonded to each other using the adhesive members AD. Further, the plurality of first binders BD1 to which the display panel 120 is bonded may be coupled to the frame 150 using the plurality of first coupling members SC1. The plurality of first coupling members SC1 and the plurality of first binders BD1 may be coupled to or separated from each other by screw coupling. Accordingly, the plurality of first binders BD1 may be easily separated from the plurality of first coupling members SC1, and the display panel 120 may also be easily separated from the frame 150. Therefore, the display panel 120 and the frame 150 are attached to and detached from each other using the plurality of first binders BD1 and the plurality of first coupling members SC1 which are screw-coupled to each other. Thus, it is possible to reduce damage to the display panel 120 and the frame 150 during disassembly and reassembly of the display panel 120 and the frame 150. Also, it is possible to easily reassemble the display panel 120 and the frame 150.

Further, since the flatness of the display panel 120 is compensated for by using the first coupling members SC1 and the first binders BD1, the adhesive members AD are not limited to the foam tape for flatness compensation and may employ various types of adhesive members AD. The foam tape may compensate for flatness, but needs to have a larger adhesive area and a stronger adhesive force than other adhesive members. Meanwhile, in the display device 100 according to an exemplary embodiment of the present disclosure, the foam tape is not used to adjust flatness. Thus, an adhesive member AD having a larger adhesive area and a greater adhesive force may be used. For example, the adhesive members AD may be acrylic double-sided tapes and may have an improved adhesive area and adhesive force compared to the foam tape. Therefore, it is possible to improve the quality of adhesion of the display panel 120 bonded to the plurality of first binders BD1 using the adhesive members AD.

Figure 6:
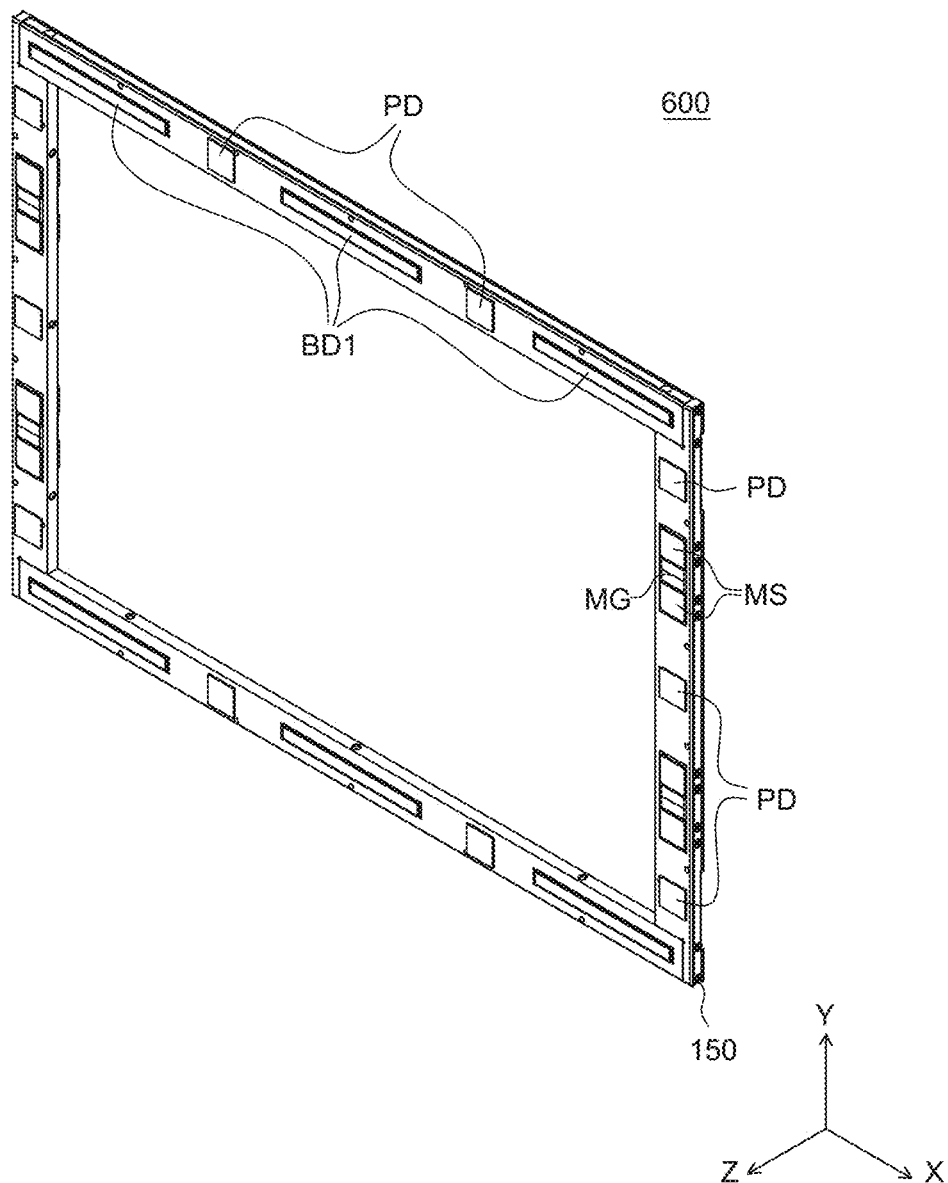
FIG. 6 is an exploded perspective view of a display device according to another exemplary embodiment of the present disclosure.
Figure 7A:
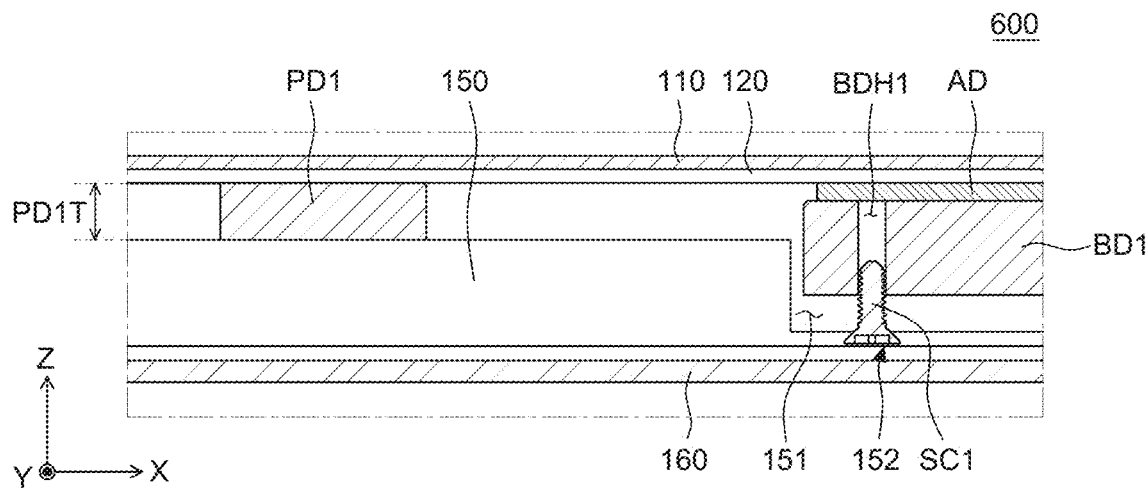
FIG. 7A and FIG. 7B are cross-sectional views of the display device according to another exemplary embodiment of the present disclosure.
Figure 7B:
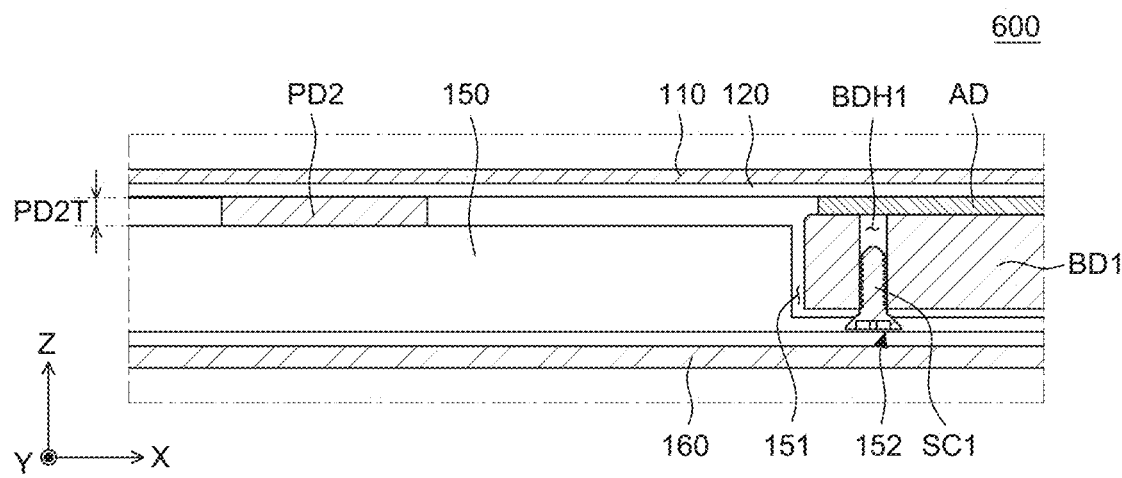

FIG. 6 is an exploded perspective view of a display device according to another exemplary embodiment of the present disclosure. FIG. 7A and FIG. 7B are cross-sectional views of the display device according to another exemplary embodiment of the present disclosure. Specifically, FIG. 6 is a perspective view as viewed from a front surface of a display device 600. For the convenience of the description, FIG. 6 illustrates only the frame 150, the plurality of first binders BD1, the plurality of first coupling members SC1, the plurality of adhesive members AD, the plurality of panel magnets MG and the plurality of panel ferromagnetic materials MS. FIG. 7A is a cross-sectional view of a first buffer pad PD1 of the display device 600 according to another exemplary embodiment of the present disclosure. FIG. 7B is a cross-sectional view of a second buffer pad PD2 of the display device 600 according to another exemplary embodiment of the present disclosure. The display device 600 according to another exemplary embodiment of the present disclosure has substantially the same configuration as the display device 100 illustrated in FIG. 1 through FIG. 5B except that the display device 600 further includes buffer pads PD. Therefore, no detailed description of the same configuration will be provided.

Referring to FIG. 6, a plurality of buffer pads PD is disposed between the display panel 120 and the frame 150. The plurality of buffer pads PD may be disposed along the edges of the display panel 120. Each of the plurality of buffer pads PD may be disposed between two of the plurality of first binders BD1. The thickness of the plurality of buffer pads PD may be changed depending on the interval between the display panel 120 and the frame 150. For example, as the interval between the display panel 120 and the frame 150 is decreased, the thickness of the plurality of buffer pads PD may be decreased by being pressed by the display panel 120 and the frame 150. The plurality of buffer pads PD may be made of a material having elasticity so that the thickness can be changed depending on the interval between the display panel 120 and the frame 150. For example, each buffer pad PD may be made of a foam pad having a plurality of pores or a rubber pad having elasticity, but is not limited thereto.

Hereinafter, for the convenience of the description, one of the plurality of buffer pads PD disposed in an area where the interval between the display panel 120 and the frame 150 is the greatest is defined as the first buffer pad PD1. Also, one of the plurality of buffer pads PD disposed in an area where the interval between the display panel 120 and the frame 150 is smallest is defined as the second buffer pad PD2. However, this is just an example and the present disclosure is not limited thereto.

Referring to FIG. 7A, the first buffer pad PD1 among the plurality of buffer pads PD may be a buffer pad PD disposed in the area where the interval between the display panel 120 and the frame 150 is greatest. Among the plurality of buffer pads PD, the first buffer pad PD1 may be least pressed and thus may have a greatest thickness PD1T. In a state where the first buffer pad PD1 is pressed by the frame 150 and the display panel 120, the first buffer pad PD1 may push the display panel 120 and the first binder BD1 in a direction to be away from the frame 150. Also, the first buffer pad PD1 may push the frame 150 in a direction to be away from the display panel 120.

Among the plurality of first binders BD1, the first binder BD1 adjacent to the first buffer pad PD1 may be farthest away from the bottom surfaces of the plurality of grooves 151. The first buffer pad PD1 is disposed in the area where the interval between the frame 150 and the display panel 120 is greatest. Therefore, the first binder BD1 fixed to the display panel 120 is also farthest away from the bottom surface of the groove 151 of the frame 150 and most protruded from the groove 151. Further, a part of the first coupling member SC1 inserted into the first fixing hole BDH1 of the first binder BD1 may have the shortest length.

In this case, the first buffer pad PD1 pushes the display panel 120 away from the frame 150. Thus, the first coupling member SC1 of which a part is inserted into the first fixing hole BDH1 of the first binder BD1 may be pulled toward the display panel 120. Herein, the head of the first coupling member SC1 is disposed on the rear surface of the frame 150 and the first coupling hole 152 through which the first coupling member SC1 penetrates is smaller than the head of the first coupling member SC1. Thus, the head of the first coupling member SC1 may not penetrate through the first coupling hole 152 toward the display panel 120, but may be fixed to the rear surface of the frame 150. Therefore, the plurality of buffer pads PD pushes the display panel 120 and the first binder BD1 away from the frame 150 to fix the first coupling member SC1 in order for the screw thread of the first coupling member SC1 not to move along the first coupling hole 152.

Referring to FIG. 7B, the second buffer pad PD2 among the plurality of buffer pads PD may be a buffer pad PD disposed in the area where the interval between the display panel 120 and the frame 150 is smallest. Among the plurality of buffer pads PD, the second buffer pad PD2 may be most pressed and thus may have a smallest thickness PD2T. In a state where the second buffer pad PD2 is pressed by the frame 150 and the display panel 120, the second buffer pad PD2 may push the display panel 120 and the first binder BD1 in a direction to be away from the frame 150. Also, the second buffer pad PD2 may push the frame 150 in a direction to be away from the display panel 120.

Among the plurality of first binders BD1, the first binder BD1 adjacent to the second buffer pad PD2 may be most adjacent to the bottom surfaces of the plurality of grooves 151. The second buffer pad PD2 is disposed in the area where the interval between the frame 150 and the display panel 120 is smallest. Therefore, the first binder BD1 fixed to the display panel 120 may be also most adjacent to the bottom surface of the groove 151 of the frame 150. Further, a part of the first coupling member SC1 inserted into the first fixing hole BDH1 of the first binder BD1 may have the greatest length.

The plurality of buffer pads PD of the display device 600 according to another exemplary embodiment of the present disclosure fills a space formed between the display panel 120 and the frame 150 to reduce a movement of the display panel 120. For example, when the frame 150 has a low flatness, the flatness of the display panel 120 may be improved using the plurality of first binders BD1 and the plurality of first coupling members SC1. Herein, when some of the first binders BD1 are protruded to the outside of the plurality of grooves 151 to adjust the flatness of the display panel 120, a space may be formed between the display panel 120 and the frame 150. In this case, the display panel 120 may be moved due to the space. Here, the plurality of buffer pads PD may be further disposed between the frame 150 and the display panel 120 to fill the space between the frame 150 and the display panel 120. That is, the buffer pads PD disposed between the frame 150 and the display panel 120 may support the display panel 120 to suppress a movement of the display panel 120. Therefore, in the display device 600 according to another exemplary embodiment of the present disclosure, the buffer pads PD are disposed between the display panel 120 and the frame 150 so that a movement of the display panel 120 may be reduced.

Further, the plurality of buffer pads PD of the display device 600 according to another exemplary embodiment of the present disclosure may reduce a movement of the plurality of first coupling members SC1 through the first coupling holes 152. Specifically, the plurality of first coupling members SC1 may penetrate through the first coupling holes 152 in the rear surface of the frame 150 and parts thereof may be inserted into the first fixing holes BDH1 of the plurality of first binders BD1, respectively. For example, if the plurality of first coupling members SC1 is screws, the heads thereof may be disposed on the rear surface of the frame 150 and the screw threads may be disposed in the plurality of grooves 151 of the frame 150 on a front surface of the frame 150. Here, the lengths of the parts of the plurality of first coupling members SC1 inserted into the first fixing holes BDH1 of the plurality of first binders BD1 may be adjusted to adjust the flatness of the display panel 120. Only parts of the screw threads of the plurality of first coupling members SC1 may be inserted into the first fixing holes BDH1 of the plurality of first binders BD1. In this case, the other parts of the screw threads not inserted into the first fixing holes BDH1 may be moved along the first coupling holes 152. In this case, even if the lengths of the parts of the first coupling members SC1 inserted into the first fixing holes BDH1 of the first binders BD1 are adjusted, the locations of the first coupling members SC1 are changed. Therefore, the locations of the first binders BD1 may be changed, and it may be difficult to adjust the flatness of the display panel 120. Here, the plurality of buffer pads PD having elasticity is disposed as pressed between the display panel 120 and the frame 150 and thus may continuously apply a force to push the display panel 120 and the frame 150. That is, the display panel 120 and the first binders BD1 fixed to the display panel 120 may be moved in a direction to be away from the frame 150 by the plurality of buffer pads PD. Also, the frame 150 may be moved in a direction to be away from the display panel 120 and the first binders BD1. Here, the screw threads of the plurality of first coupling members SC1 are coupled to the first fixing holes BDH1 of the first binders BD1, and, thus, the plurality of first coupling members SC1 may be pulled in a direction to be away from the frame 150 along the first binders BD1. Herein, the heads of the plurality of first coupling members SC1 are disposed on the rear surface of the frame 150 and the first coupling hole 152 is smaller than the head of the first coupling member SC1. Thus, the head of the first coupling member SC1 may not penetrate through the first coupling hole 152, but may be fixed to the rear surface of the frame 150. Therefore, since the buffer pads PD are disposed between the display panel 120 and the frame 150, it is possible to reduce a movement of a part of the first coupling member SC1, which is not inserted into the first fixing hole BDH1, through the first coupling hole 152. Also, it is possible to easily fix the location of the first binder BD1.

Figure 8:
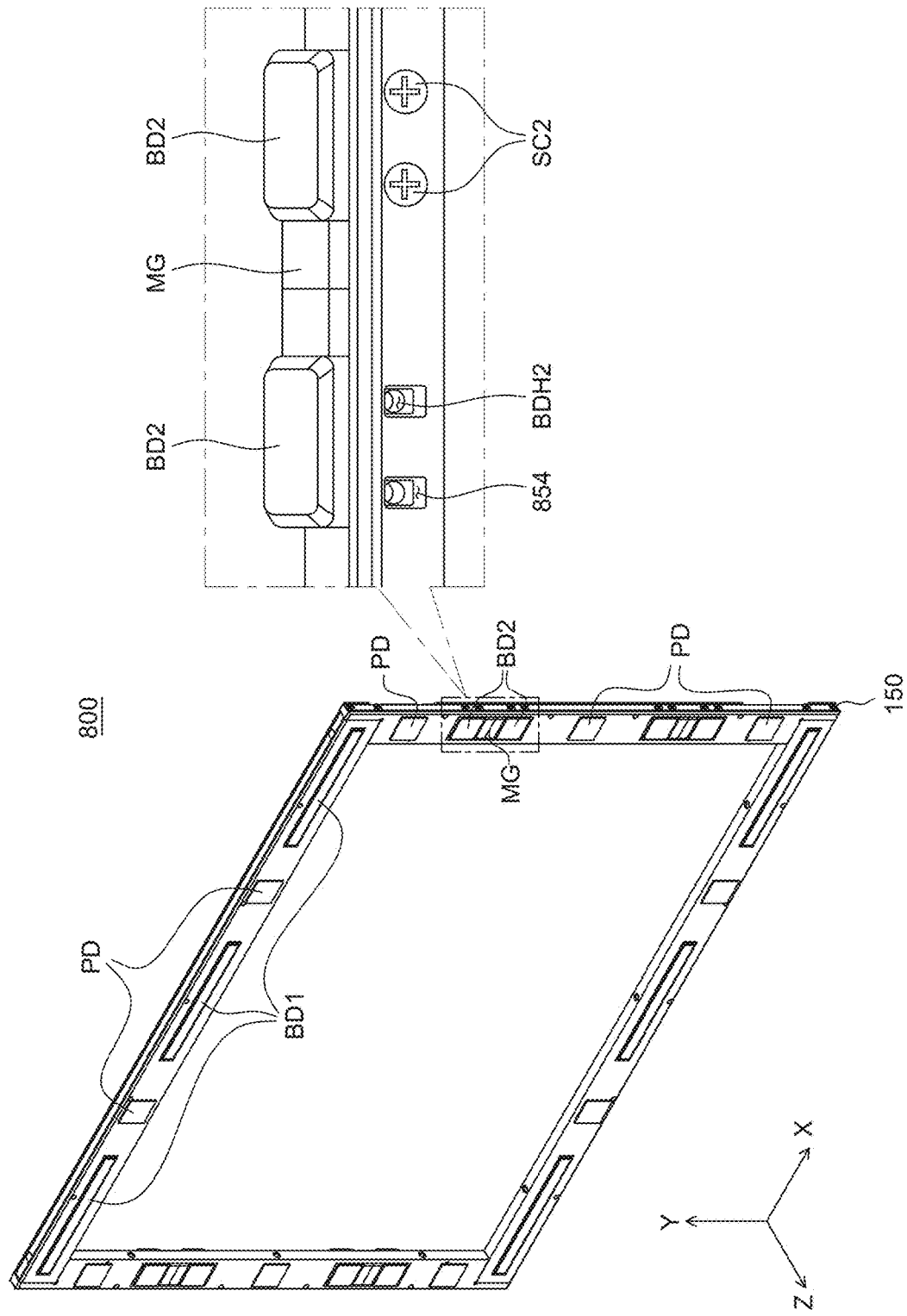
FIG. 8 is an exploded perspective view of a display device according to yet another exemplary embodiment of the present disclosure.
Figure 9:
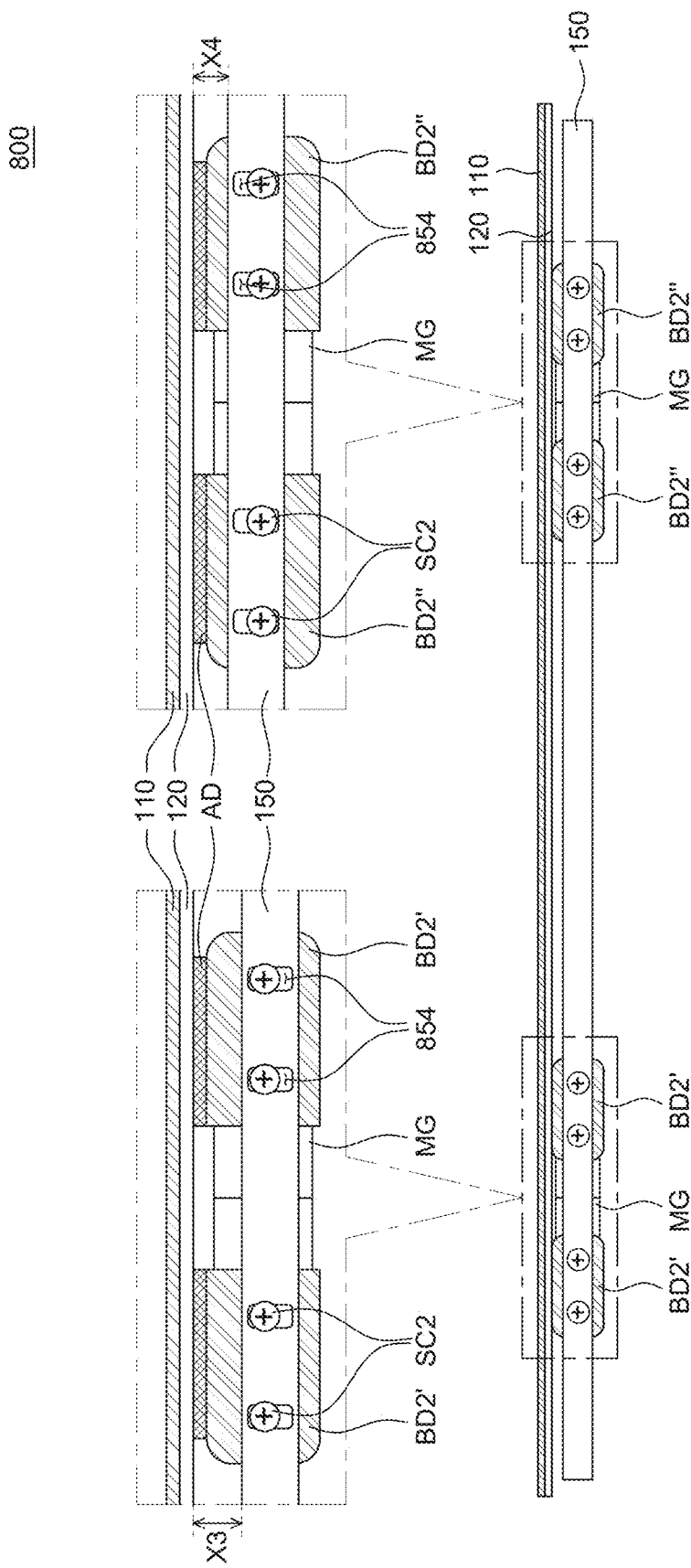
FIG. 9 is side views of the display device according to yet another exemplary embodiment of the present disclosure.

FIG. 8 is an exploded perspective view of a display device according to yet another exemplary embodiment of the present disclosure. FIG. 9 shows side views of the display device according to yet another exemplary embodiment of the present disclosure. FIG. 8 is a perspective view as viewed from a front surface of a display device 800, and FIG. 9 is a side view of the display device 800 as viewed from the right side of the display device 800. For the convenience of the description, FIG. 8 illustrates only the frame 150, the plurality of first binders BD1, a plurality of second binders BD2, the plurality of adhesive members AD, the buffer pads PD and the plurality of panel magnets MG. FIG. 9 omits the illustration of the cover shield 160. The display device 800 illustrated in FIG. 8 and FIG. 9 has substantially the same configuration as the display device 600 illustrated in FIG. 6 and FIG. 7 except that the display device 800 further includes the plurality of second binders BD2 and a plurality of second coupling members SC2. Therefore, no detailed description of the same configuration will be provided.

Referring to FIG. 8, a plurality of binders includes the plurality of first binders BD1 and the plurality of second binders BD2. The plurality of first binders BD1 has substantially the same configuration as the first binders BD1 illustrated in FIG. 1 through FIG. 5B. The plurality of second binders BD2 is configured to couple the display panel 120 and the frame 150, attach the display device 800 to the wall portion 200 and also adjust the flatness of the display panel 120.

The plurality of first binders BD1 is configured to adjust the flatness of the display panel 120 while and after the display panel 120 and the frame 150 are assembled. The plurality of second binders BD2 is configured to adjust the initial flatness when the display panel 120 and the frame 150 are assembled. The flatness of the display panel 120 may be primarily adjusted using the plurality of first binders BD1 and the plurality of second binders BD2 when the display panel 120 and the frame 150 are assembled. Then, the flatness of the display panel 120 may be secondarily adjusted using the plurality of first binders BD1 after the display panel 120 and the frame 150 are assembled.

The plurality of second binders BD2 may be disposed on both side surface of each of the plurality of panel magnets MG in the plurality of holes 153 of the frame 150. Each of the plurality of panel magnets MG may be disposed between the plurality of second binders BD2. For example, one of the plurality of second binders BD2 may be in contact with the N pole of the panel magnet MG and another second binder BD2 may be in contact with the S pole of the panel magnet MG. The plurality of second binders BD2 and the panel magnet MG disposed in a single hole 153 may be fixed to each other and may be moved together in the hole 153 of the frame 150.

The plurality of second binders BD2 may be made of a ferromagnetic material. The plurality of second binders BD2 made of a ferromagnetic material may attach the display device 800 to the wall portion 200. For example, when the display device 800 is brought into contact with the wall portion 200, magnetic lines of force are induced among the plurality of panel magnets MG, the plurality of second binders BD2 and the wall portion 200. Thus, the display device 800 may be fixed to the wall portion 200. Accordingly, the plurality of second binders BD2 may function to adjust the flatness of the display panel 120 and attach the display device 800 to the wall portion 200.

In the drawings, the plurality of second binders BD2 is illustrated as a ferromagnetic material disposed on both side surfaces of each of the plurality of panel magnets MG. However, the plurality of second binders BD2 may be inserted into other holes 153 of the frame 150 in which the plurality of panel magnets MG is not disposed, or may be made of a material having rigidity instead of a ferromagnetic material. However, the present disclosure is not limited thereto.

The plurality of second binders BD2 includes second fixing holes BDH2 to be coupled to the plurality of second coupling members SC2. The plurality of second binders BD2 may be inserted into the plurality of holes 153 of the frame 150 and coupled to the plurality of second coupling members SC2. Here, the plurality of second binders BD2 may be coupled to the second coupling members SC2 in a state where the plurality of second binders BD2 is disposed inside the plurality of holes 153 of the frame 150. The second fixing holes BDH2 are configured to fix the plurality of second binders BD2 and the plurality of second coupling members SC2 and may be formed in side surfaces of the second binders BD2 corresponding to an outer side surface of the frame 150. For example, the second coupling members SC2 may be screws with threads and the second fixing holes BDH2 of the second binders BD2 may be screw holes with threads on the inner circumferential surfaces.

The frame 150 includes a plurality of second coupling holes 854. The plurality of second coupling holes 854 is formed in the outer side surface of the frame 150 and may communicate with the plurality of holes 153 of the frame 150. The plurality of second coupling holes 854 allows the plurality of second coupling members SC2 to penetrate therethrough. The plurality of second coupling members SC2 may be inserted through the plurality of second coupling holes 854 into the second fixing holes BDH2 of the second binders BD2 inserted into the plurality of holes 153.

Here, the plurality of second coupling holes 854 is slot holes longer than the second fixing holes BDH2 of the second binders BD2. The plurality of second coupling holes 854 may be formed longer than the plurality of first coupling holes 152 and may have a slot shape. For example, one end of each of the plurality of second coupling holes 854 may be disposed adjacent to one surface of the frame 150 facing the display panel 120. Also, the other end of each of the plurality of second coupling holes 854 may be disposed adjacent to the opposite surface of the one surface of the frame 150. The second coupling members SC2 inserted into the plurality of second coupling holes 854 and the second binders BD2 including the second fixing holes BDH2 screw-coupled to the second coupling members SC2 can move along a longitudinal direction of the second coupling holes 854.

The plurality of adhesive members AD is disposed between the plurality of first binders BD1 and the display panel 120 and between the plurality of second binders BD2 and the display panel 120. The adhesive members AD may be made of an adhesive material to fix the first binders BD1 and the second binders BD2 to the rear surface of the display panel 120. For example, the adhesive members AD may be adhesive acrylic double-sided tapes, but are not limited thereto.

Meanwhile, the second coupling holes 854 of the frame 150 are formed into slot holes to adjust the flatness of the display panel 120, which will be described in detail with reference to FIG. 9.

Hereinafter, for the convenience of the description, one of the plurality of second binders BD2 disposed in an area where the interval between the display panel 120 and the frame 150 is the greatest is defined as a second binder BD2'. Also, one of the plurality of second binders BD2 disposed in an area where the interval between the display panel 120 and the frame 150 is smallest is defined as a second binder BD2". However, this is just an example and the present disclosure is not limited thereto.

Referring to FIG. 9, one surface of the plurality of second binders BD2 are disposed on the same plane. Since the plurality of second binders BD2 is disposed on the same plane, the flatness of the display panel 120 attached to the one surface of the plurality of second binders BD2 may also be improved.

Here, coupling locations of the second coupling holes 854 and the second fixing holes BDH2 of the second binders BD2 may be different depending on the flatness of the frame 150. For example, the plurality of second coupling members SC2 and the second fixing holes BDH2 of the plurality of second binders BD2 may be located at different locations between one ends and the other ends of the second coupling holes 854. The shortest distance from each of the plurality of second coupling members SC2 to one surface of the frame 150 may vary depending on the flatness of the frame 150.

For example, if the frame 150 has a uniform flatness, coupling locations of the second fixing holes BDH2 of the second binders BD2 and the second coupling holes 854 of the frame 150 may be identical. However, when the frame 150 is bent, the coupling locations of the second coupling holes 854, which are slot holes, and the second fixing holes BDH2 of the second binders BD2 may be different, respectively. That is, the second coupling holes 854 of the frame 150 are long-slotted holes, and, thus, the second coupling members SC2 and the second fixing holes BDH2 may move inside the second coupling holes 854 along the longitudinal direction of the second coupling holes 854.

For example, referring to FIG. 9, the second binder BD2' disposed in the area where an interval X3 between the display panel 120 and the frame 150 is the greatest may be most protruded from the one surface of the frame 150. In the area where the interval X3 between the display panel 120 and the frame 150 is the greatest, the frame 150 is most bent in a direction to be away from the display panel 120. In this area, the second coupling holes 854 of the frame 150 may be disposed relatively far away from the display panel 120. Also, in the area where the interval X3 between the display panel 120 and the frame 150 is greatest, the second binder BD2' may be most protruded from the plurality of hole 153 of the frame 150 to support the display panel 120 flatly. In this case, the second coupling hole 854 of the frame 150 may be disposed away from one surface of the second binder BD2'. Also, one end of the second coupling hole 854 adjacent to the one surface of the frame 150 may be disposed away from the one surface of the second binder BD2'. Therefore, the second fixing hole BDH2 of the second binder BD2' disposed in the area where the interval X3 between the display panel 120 and the frame 150 is the greatest may be disposed adjacent to the one end of the second coupling hole 854. Also, the second coupling member SC2 fixing the second binder BD2' and the frame 150 may be disposed adjacent to the one end of the second coupling hole 854.

Further, the second binder BD2" disposed in the area where an interval X4 between the display panel 120 and the frame 150 is smallest may be least protruded from the one surface of the frame 150. In the area where the interval X4 between the display panel 120 and the frame 150 is smallest, the frame 150 is most bent toward the display panel 120. In this area, the second coupling holes 854 of the frame 150 may be disposed relatively adjacent to the display panel 120. Also, in the area where the interval X4 between the display panel 120 and the frame 150 is smallest, the second binder BD2" may be least protruded from the plurality of hole 153 of the frame 150. Also, the one end of the second coupling hole 854 adjacent to the one surface of the frame 150 may be disposed adjacent to one surface of the second binder BD2" and the display panel 120. Therefore, the second fixing hole BDH2 of the second binder BD2" disposed in the area where the interval X4 between the display panel 120 and the frame 150 is smallest may be disposed adjacent to the other end of the second coupling hole 854. Also, the second coupling member SC2 fixing the second binder BD2" and the frame 150 may be disposed adjacent to the other end of the second coupling hole 854.

Therefore, the plurality of second binders BD2 whose one surface are disposed on the same plane may be fixed to the second coupling holes 854 which are slot holes of the frame 150. Thus, the flatness of the display panel 120 may be improved without being limited to the flatness of the frame 150.

Meanwhile, the plurality of second binders BD2 and the frame 150 may be assembled on a flat plate to improve the flatness of the display panel 120. The flat plate is a table whose one surface has a high flatness. The plurality of second binders BD2 may be disposed on the flat plate so that the one surface of the plurality of second binders BD2 may be disposed on the same plane. Further, in a state where the plurality of second binders BD2 is disposed on the same plane, the second coupling members SC2 may be inserted into the second coupling holes 854, which are slot holes, to couple the plurality of second binders BD2 and the frame 150. In a state where the flatness of the plurality of second binders BD2 to which the display panel 120 is attached is maintained, the plurality of second binders BD2 is fastened to the frame 150. Thus, the flatness of the display panel 120 attached to the plurality of second binders BD2 may be improved regardless of the flatness of the frame 150.

In this case, the thickness of the plurality of second binders BD2 may be greater than the thickness of the frame 150. The thickness of the plurality of second binders BD2 may be designed to be greater than the thickness of the frame 150 in view of an error range of the flatness of the frame 150 caused by tolerances during the manufacturing of the frame 150. If the second binder BD2 has the same thickness as the frame 150, when the frame 150 is bent, one surface of at least some of the plurality of second binders BD2 inserted into the plurality of holes 153 of the frame 150 are disposed inside the plurality of holes 153. Thus, the second binders BD2 may not be attached to the display panel 120 and may not support the display panel 120 flatly. Therefore, the thickness of the plurality of second binders BD2 is designed to be greater than the thickness of the frame 150 in order for the one surface of the second binders BD2 not to be disposed inside the plurality of holes 153. Also, the second binders BD2 may support the display panel 120 flatly.

In the display device 800 according to yet another exemplary embodiment of the present disclosure, the plurality of second coupling holes 854, which is slot holes, is formed in side surface of the frame 150. Also, the plurality of second coupling holes 854 is fastened to the plurality of second binders BD2. Thus, the flatness of the display panel 120 may be improved without being limited to the flatness of the frame 150. First, the plurality of holes 153 may be formed in the frame 150 and the plurality of second binders BD2 may be disposed inside the plurality of holes 153. Then, the second coupling members SC2 may be inserted into the plurality of second coupling holes 854 formed in the side surface of the frame 150 and the second fixing holes BDH2 formed in the side surfaces of the second binders BD2. Thus, the plurality of second binders BD2 may be fastened to the frame 150. Here, the second coupling holes 854 formed in the side surface of the frame 150 are slot holes. Therefore, the second fixing holes BDH2 of the plurality of second binders BD2 and the second coupling members SC2 may move along the longitudinal direction of the second coupling holes 854. Accordingly, in a state where the flatness between the plurality of second binders BD2 is adjusted, the plurality of second binders BD2 may be fastened to the frame 150. Therefore, the plurality of second binders BD2 is coupled to the frame 150 in a state where each of the flatness of the plurality of second binders BD2 is adjusted. Thus, the flatness of the display panel 120 may be improved without being limited to the flatness of the frame 150.

The exemplary embodiments of the present disclosure can also be described as follows:

According to an aspect of the present disclosure, there is provided a display device. The display device includes a display panel, a frame diposed on a rear surface of the display panel, a plurality of binders fixed to the rear surface of the display panel and disposed between the display panel and the frame, and a plurality of coupling members penetrating the frame and coupled to the plurality of binders.

The frame may include a plurality of grooves into which a plurality of first binders among the plurality of binders is inserted, a plurality of holes into which a plurality of second binders among the plurality of binders is inserted, a plurality of first coupling holes which is disposed in one surface of the frame and communicates with the plurality of grooves and through which the plurality of coupling members penetrates, and a plurality of second coupling holes which is disposed in a side surface of the frame and communicates with the plurality of holes and through which the plurality of coupling members penetrates.

The plurality of first binders may include first fixing holes disposed in one surface of the plurality of first binders so as to correspond to the plurality of first coupling holes and coupled to the plurality of coupling members, and the plurality of second binders may include second fixing holes disposed in side surface of the plurality of second binders so as to correspond to the plurality of second coupling holes and coupled to the plurality of coupling members.

When the plurality of coupling members is rotated inside the first fixing holes, the plurality of first binders may be movable to the outside or inside of the plurality of grooves.

Lengths of parts of the plurality of coupling members inserted into the plurality of first binders, respectively, may be different from each other.

One of the plurality of coupling members coupled to a first binder disposed in an area where a distance between the display panel and the frame may be the greatest has the shortest part disposed inside the first fixing hole.

Each of the second coupling holes may be a slot hole extended from one surface of the frame toward the other surface of the frame, and the plurality of coupling members may be movable from the second coupling holes toward the one surface of the frame or the other surface of the frame.

The shortest distance from each of the plurality of coupling members inserted into the second coupling holes to one surface of the frame may vary.

The display device may further include adhesive members disposed between the plurality of binders and the display panel.

The plurality of binders may be disposed adjacent to edges of the display panel.

The display device may further include a plurality of flexible films bonded to the rear surface of the display panel, a printed circuit board electrically connected to the plurality of flexible films, and a cover shield disposed on a rear surface of the frame and configured to cover the plurality of flexible films and the printed circuit board. The plurality of flexible films and the printed circuit board may be disposed to surround the frame.

According to another aspect of the present disclosure, there is provided a display device. The display device includes a display panel, a plurality of binders bonded to a rear surface of the display panel, an adhesive member that bonds the plurality of binders and the display panel, a frame disposed to cover the display panel and the plurality of binders, and a plurality of coupling members coupled to the frame and the plurality of binders. Some of the plurality of coupling members are coupled to one surface of the plurality of binders, and the others of the plurality of coupling members are coupled to side surfaces of the plurality of binders.

The plurality of binders may include a plurality of first binders whose one surface include first fixing holes into which the plurality of coupling members is inserted, and a plurality of second binders whose side surfaces include second fixing holes into which the plurality of coupling members is inserted. The frame may include a plurality of grooves on which the plurality of first binders is mounted, and a plurality of holes into which the plurality of second binders is inserted.

When the plurality of coupling members is rotated inside the first fixing holes in any one of a clockwise direction and a counter-clockwise direction, one ends of the plurality of coupling members may move to the outside of the first fixing holes and the plurality of first binders may move to the outside of the plurality of grooves. When the plurality of coupling members is rotated inside the first fixing holes in the other of the clockwise direction and the counter-clockwise direction, the one ends of the plurality of coupling members may move to the inside of the first fixing holes and the plurality of first binders may move to the inside of the plurality of grooves.

The frame may further include a plurality of first coupling holes which is disposed in bottom surfaces of the plurality of grooves and through which the plurality of coupling members penetrates, and a plurality of second coupling holes which is disposed in a side surface of the frame to overlap the plurality of holes and through which the plurality of coupling members penetrates. The plurality of coupling members may be coupled to the plurality of binders with the frame interposed therebetween.

A length of the plurality of second coupling holes may be greater than a length of the plurality of first coupling holes, and the plurality of coupling members and the plurality of second binders may be movable along a longitudinal direction of the plurality of second coupling holes.

The display device may further include a plurality of buffer pads disposed between the display panel and the frame. The plurality of buffer pads may be different in thickness from each other.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
   a display panel;
   a display element disposed in the display panel;
   a protection plate disposed to cover a front surface of the display panel;
   a frame disposed on a rear surface of the display panel and including a plurality of grooves and a plurality of holes;
   a plurality of first binders bonded to the rear surface of the display panel and disposed in the plurality of grooves;
   a plurality of second binders bonded to the rear surface of the display panel and disposed inside the plurality of holes;
   a plurality of first coupling members penetrating the frame and coupled to the plurality of first binders;
   a plurality of second coupling members penetrating the frame and coupled to the plurality of second binders; and
   a plurality of adhesive members disposed between the plurality of first binders and the display panel, and between the plurality of second binders and the display panel,
   wherein the display panel is an inorganic light emitting display panel, and the display element is a light emitting diode (LED) or a micro LED including an n-type semiconductor layer, a p-type semiconductor layer, and an emission layer.

2. The display device according to claim 1, wherein side surfaces of the display panel, a front surface of the protection plate and side surfaces of the protection plate are exposed from the frame.

3. The display device according to claim 1, wherein the plurality of adhesive members is not disposed between the display panel and the frame.

4. The display device according to claim 1, wherein the display panel, the plurality of first binders and the plurality of second binders are configured to be detachable from the frame by adjusting the plurality of first coupling members and the plurality of second coupling members.

5. The display device according to claim 1, wherein the frame further includes:
   a plurality of first coupling holes which are disposed in one surface of the frame and communicates with the plurality of grooves and through which the plurality of first coupling members penetrates; and
   a plurality of second coupling holes which are disposed in a side surface of the frame and communicates with the plurality of holes and through which the plurality of second coupling members penetrates.

6. The display device according to claim 5, wherein the plurality of first binders include first fixing holes disposed in one surface of the plurality of first binders so as to correspond to the plurality of first coupling holes and coupled to the plurality of first coupling members, and
   the plurality of second binders include second fixing holes disposed in a side surface of the plurality of second binders so as to correspond to the plurality of second coupling holes and coupled to the plurality of second coupling members.

7. The display device according to claim 6, wherein when the plurality of first coupling members are rotated inside the first fixing holes, the plurality of first binders are movable to an outside or inside of the plurality of grooves.

8. The display device according to claim 7, wherein when some of the plurality of first coupling members are rotated inside the first fixing holes in any one of a clockwise direction and a counter-clockwise direction, one ends of the some of the plurality of first coupling members move to an outside of the first fixing holes, and the plurality of first binders move to an outside of the plurality of grooves, and
   when the some of the plurality of first coupling members are rotated inside the first fixing holes in the other of the clockwise direction and the counter-clockwise direction, the one ends of the some of the plurality of first coupling members move to an inside of the first fixing holes, and the plurality of first binders move to an inside of the plurality of grooves.

9. The display device according to claim 6, wherein lengths of parts of the plurality of first coupling members inserted into the plurality of first binders, respectively, are different from each other.

10. The display device according to claim 6, wherein one of the plurality of first coupling members coupled to a first binder disposed in an area where a distance between the display panel and the frame is the greatest has the shortest part disposed inside the first fixing holes.

11. The display device according to claim 6, wherein each of the plurality of second coupling holes is a slot hole extended from one surface of the frame toward the other surface of the frame, and
    the plurality of second coupling members are movable from the plurality of second coupling holes toward the one surface of the frame or the other surface of the frame.

12. The display device according to claim 6, wherein a length of the plurality of second coupling holes is greater than a length of the plurality of first coupling holes, and
    the plurality of second coupling members and the plurality of second binders are movable along a longitudinal direction of the plurality of second coupling holes.

13. The display device according to claim 6, wherein the shortest distance from each of the plurality of second coupling members inserted into the plurality of second coupling holes to one surface of the frame varies.

14. The display device according to claim 1, wherein the plurality of first binders and the plurality of second binders are disposed adjacent to edges of the display panel.

15. The display device according to claim 1, further comprising:
    a plurality of flexible films bonded to the rear surface of the display panel;
    a printed circuit board electrically connected to the plurality of flexible films; and
    a cover shield disposed on a rear surface of the frame and configured to cover the plurality of flexible films and the printed circuit board,
    wherein the plurality of flexible films and the printed circuit board are disposed to surround the frame.

16. The display device according to claim 1, further comprising:
a plurality of buffer pads disposed between the display panel and the frame,
wherein the plurality of buffer pads are different in thickness from each other.

* * * * *